United States Patent [19]

Eastmond et al.

[11] Patent Number: 4,893,349
[45] Date of Patent: *Jan. 9, 1990

[54] FM COMMUNICATION SYSTEM WITH IMPROVED RESPONSE TO RAYLEIGH-FADED RECEIVED SIGNALS

[75] Inventors: Bruce C. Eastmond; Wai Elliott Lum, Palatine, both of Ill.

[73] Assignee: Motorola, Inc., Schaumburg, Ill.

[*] Notice: The portion of the term of this patent subsequent to Jan. 9, 2007, has been disclaimed.

[21] Appl. No.: 91,160

[22] Filed: Aug. 28, 1987

Related U.S. Application Data

[63] Continuation-in-part of Ser. No. 926,060, Nov. 3, 1986, abandoned, which is a continuation-in-part of Ser. No. 847,962, Apr. 3, 1986, abandoned.

[51] Int. Cl.$^4$ .......................... H04B 1/10; H04B 15/00
[52] U.S. Cl. ....................................... 455/205; 455/52; 455/212; 455/249
[58] Field of Search .................. 455/205, 206, 210–212, 455/235, 249, 52, 312, 67, 218; 381/94, 104, 106

[56] References Cited

U.S. PATENT DOCUMENTS

| | | | |
|---|---|---|---|
| 3,036,211 | 5/1962 | Broadhead, Jr. et al. | 455/243 |
| 3,568,068 | 3/1971 | Russell, Jr. | 455/210 |
| 3,832,628 | 8/1974 | Ohashi et al. | 455/210 |
| 3,982,186 | 11/1976 | Furuno | 455/205 |
| 4,013,964 | 3/1977 | Skutta | 455/245 |
| 4,123,711 | 10/1978 | Chow | 455/72 |
| 4,132,953 | 1/1979 | Martin, III | 455/218 |
| 4,160,873 | 7/1979 | Beseke et al. | 370/34 |
| 4,225,975 | 9/1980 | Iwamoto | 455/218 X |
| 4,313,215 | 1/1982 | Jansen | 455/212 |
| 4,359,780 | 11/1982 | Day | 455/222 |
| 4,379,207 | 4/1983 | Kubota | 455/205 |
| 4,393,354 | 7/1983 | McGinn | 330/280 |
| 4,403,348 | 9/1983 | Leland | 455/203 |
| 4,450,590 | 5/1984 | Lafferty et al. | 455/214 |
| 4,464,791 | 8/1984 | Eness | 455/67 |
| 4,466,129 | 8/1984 | Skutta | 455/219 |
| 4,514,703 | 4/1985 | Maher | 330/279 |
| 4,580,286 | 4/1986 | Richards | 455/168 |
| 4,648,126 | 3/1987 | Tuffolo | 455/212 |

FOREIGN PATENT DOCUMENTS 657 3/1938 Fed. Rep. of Germany .

OTHER PUBLICATIONS

Burrows, D. F., and McGeehan, J. P., "The Use of Feedforward Automatic Gain Control for Reducing Fast Fading in Single Sideboard Mobile Radio Systems", IEE International Conference on Radio Conservation Techniques, (Jul. 7–9, 1980).

Carter, Jr., C. W., et al. "Application of Compandors to Telephone Circuits", A.I.E.E., vol. 65, 1946, pp. 2079–1085.

(List continued on next page.)

[57] ABSTRACT

An improved FM communication system is disclosed in which noise bursts and pops in the audio output of the receiver, due to weak and Rayleigh-faded signals, are minimized by selectively attenuating the audio signal in the receiver. The amount and rate of attenuation for the receiver noise reduction circuits is determined by a control signal derived form either the average discriminator noise at frequencies above 3 kHz, or from a received RF signal strength indicator, or a combination of both. The audio output is attenuated during weak signals or Rayleigh fades only when the attenuation control signal increases above a predetermined signal-to-noise ratio threshold. Also described are further improvements to noise attenuation devices used in combination with the receiver noise reduction circuits to enhance audio quality in particular applications, e.g., FM repeater systems which may incorporate multiple transmitters in a simulcast configuration.

100 Claims, 14 Drawing Sheets

OTHER PUBLICATIONS

Davis, B. R., "FM Noise with Fading Channels and Diversity", *IEEE Transaction on Communication Technology,* vol. COM-19, No. 6, (Dec. 1971), pp. 1189-1200.

Hellwarth, G. A., and Jones, G. D., "Automatic Conditioning of Speech Signals", *IEEE Transaction on Audio and Electroacoustics,* vol. AU-16, No. 2, (Jun. 1968), pp. 169-179.

Mack, C. L., "Diversity Reception in UHF Long-Range Communications", *Proceedings of the IRE,* (Oct. 1955), pp. 1281-1289.

Norman, N. C., "A Noise Reducer for Radio-Telephone Circuits", *Bell Laboratories Record,* (May. 1937), pp. 281-285.

Norwine, A. C., "Devices for Controlling Amplitude Characteristics of Telephonic Signals", *Pacific Coast Convention of A.I.E.E.,* Aug. 9-12, 1938, pp. 539-554.

Rustako, Jr., A. J., "Performance of a Two Branch Post-Detection Combining U.H.F. Mobile Radio Space Diversity Receiver", Newark College of Engineering, (Newark, N.J.), 1969.

Taylor, C. C., "Radio Telephone Noise Reduction by Voice Control at Receiver", *The Bell System Technical Journal,* (Oct. 1937), pp. 475-486.

Motorola Instruction Manual, No. 68P81028E65, Pulsar Control Terminal (Oct. 1975), Sections 4-5.

Motorola Instruction Manual, No. 68P81029A35, IMIS Conrol Terminal (Apr. 1966), Sections 23.

Signetics Analog Applications Manual, 1979, pp. 225-237.

*Primary Examiner*—Benedict V. Safourek
*Assistant Examiner*—Ralph E. Smith
*Attorney, Agent, or Firm*—Joseph P. Krause; Stephen G. Parmelee

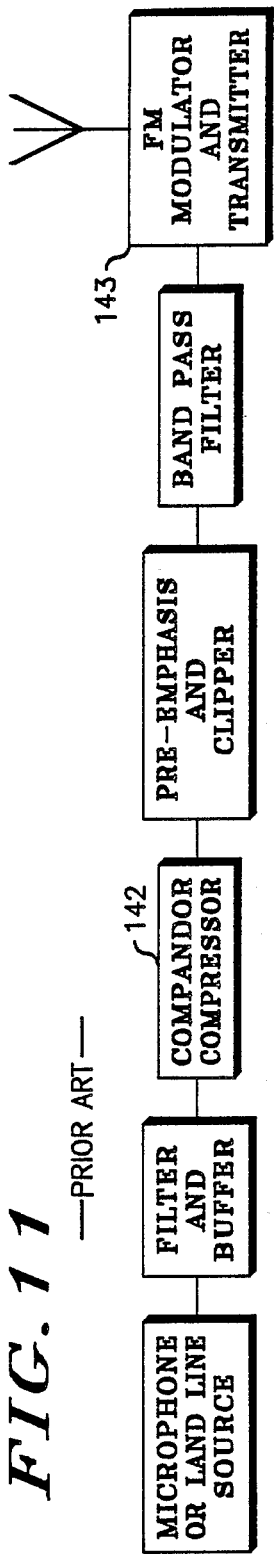
FIG. 11 —PRIOR ART—
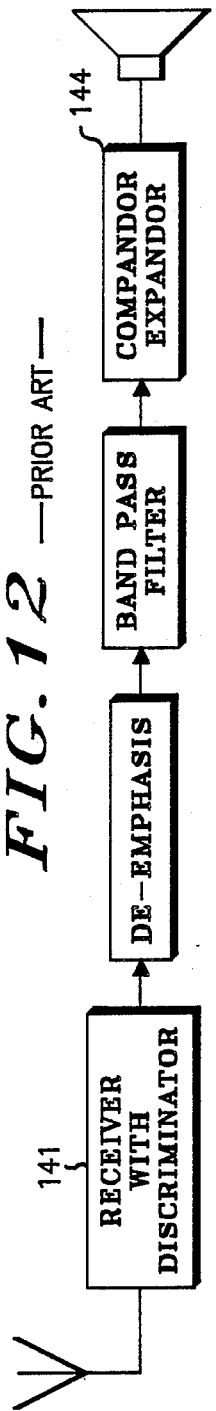
FIG. 12 —PRIOR ART—
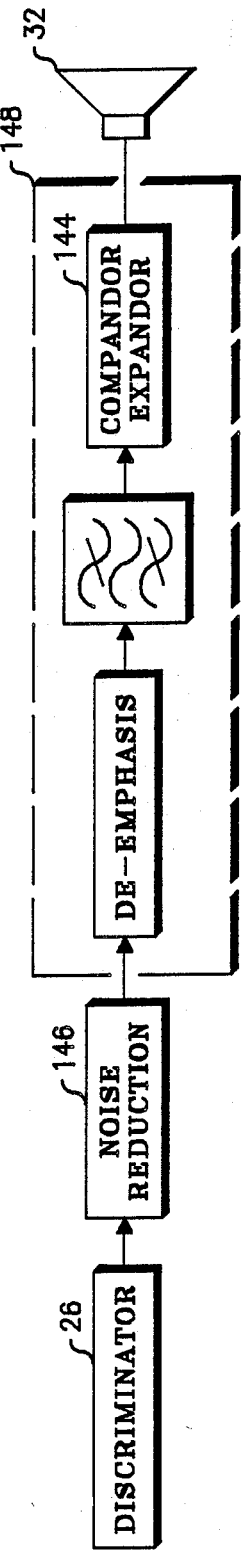
FIG. 13

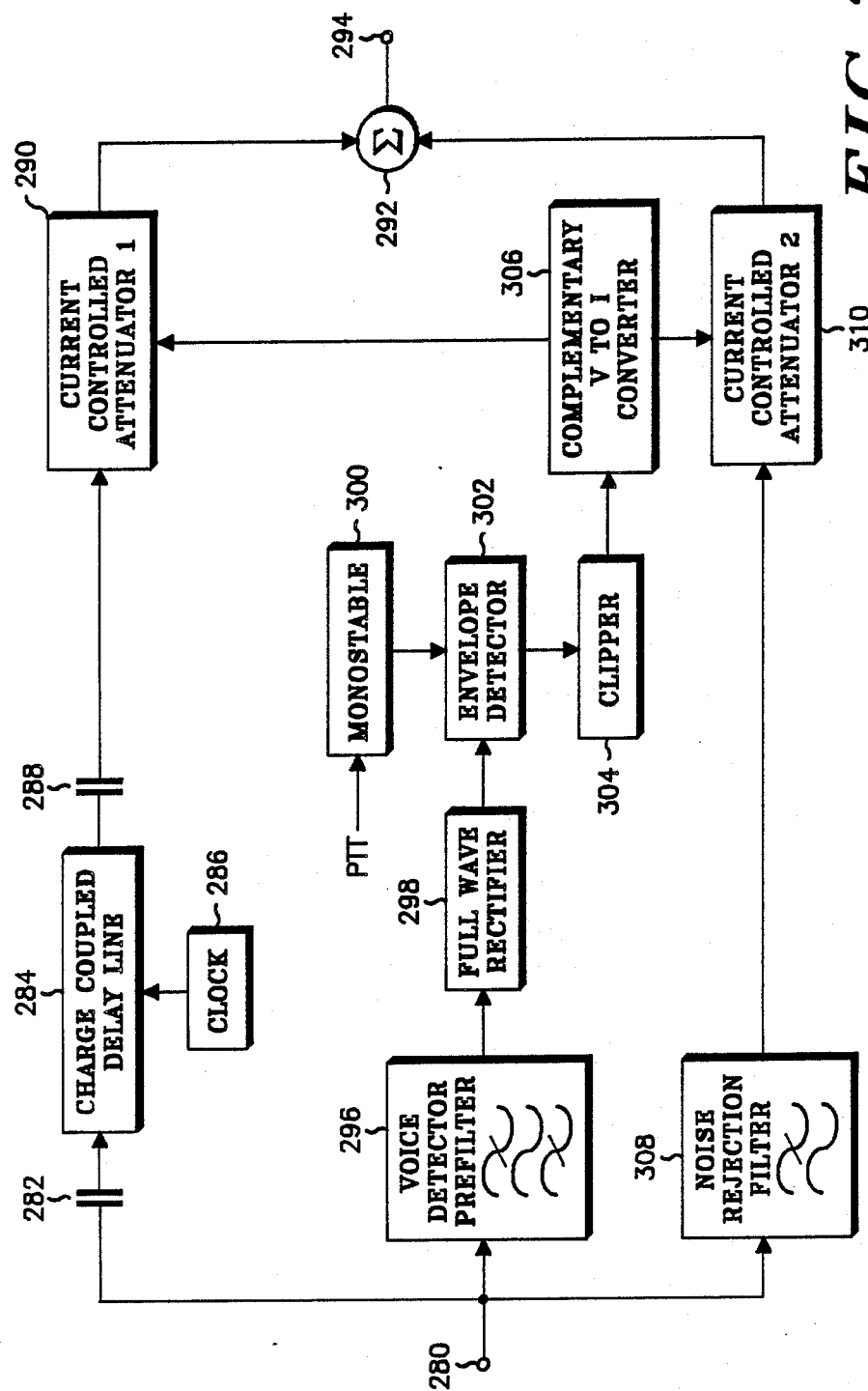

FM COMMUNICATION SYSTEM WITH IMPROVED RESPONSE TO RAYLEIGH-FADED RECEIVED SIGNALS

CROSS-REFERENCES TO RELATED APPLICATIONS

This is a continuation-in-part of application Ser. No. 926,060, filed Nov. 3, 1986, now abandoned, which is a continuation-in-part of application Ser. No. 847,962, filed Apr. 3, 1986 also abandoned. This application contains subject matter related to application Ser. No. 090,982 filed concurrently herewith, and application Ser. No. 926,064, filed Nov. 3, 1986 now abandoned. Furthermore, this application incorporates by reference U.S. Pat. No. 4,514,703, assigned to the same assignee as the present application.

BACKGROUND OF THE INVENTION

This invention generally relates to frequency modulated (FM) communication systems. The present invention is more specifically directed to improving the audio sound quality by reducing the magnitude of audible pops and bursts of noise that occur during received signal minimums caused by Rayleigh-faded received signals. The invention is especially effective for FM systems which utilize peak deviations of less than 5.0 kilohertz (kHz).

In order to appreciate this invention, the concept of a Rayleigh-faded signal should be understood. Rayleigh fading refers to the rapid fluctuations in the magnitude and/or phase of the received signal resulting from multipath propagation. A Rayleigh-faded signal is most objectionable to a listener when the magnitude of a fade is large enough to cause a substantial momentary decrease in the received signal amplitude. This results in the listener hearing an objectionable burst of noise. A common example of Rayleigh fading occurs when a mobile radio user travels down a highway while receiving a signal having rapid and substantial magnitude fluctuations in field strength. Such fluctuations may be caused by the vehicle passing relatively nearby objects, such as telephone poles or buildings, which result in field strength variations at the vehicle's mobile antenna.

If the reduction in signal amplitude due to Rayleigh fading is sufficient to reduce the IF carrier-to-noise (C/N) ratio to less than approximately 10 dB, noise in the receiver input stages will dominate and produce a burst of noise in the audio during the signal null. On the other hand, if the mean amplitude of the signal is very large, such that reduction of the IF C/N to less than 10 dB is unlikely, a noise "pop" will be generated by the discriminator during each signal null. This noise pop is due to the signal phase modulation which occurs as the signal amplitude drops, and is sometimes referred to as "random FM".

These undesired audio responses due to Rayleigh fading become more objectionable as the peak transmitted deviation decreases and the carrier frequency increases. Deviation is a factor in determining the signal-to-noise ratio. In order to achieve a given level of audio output, more audio gain will be required in a system having smaller peak deviation. Because this greater gain also amplifies the undesired noise burst or pop, these disturbances become louder relative to the desired audio (having smaller deviation) and, hence, the disturbances are rendered more objectionable. Since wavelength decreases as frequency increases, a larger number of signal strength nulls exist at higher frequencies. Thus, these audio disturbances are more likely to be encountered by a mobile radio operating at higher frequencies.

Since the available frequency spectrum is limited, and since there continues to be an increasing demand for wireless communication channels, it is apparent that better utilization of the current available communication channels is desired. One way to increase the available channels is to divide the current channel bandwidths and provide more narrowband channels. For example, if an existing 25 kHz channel is divided in half, two 12.5 kHz channels would exist. Obviously, narrower channels require that transmitted signals occupy less bandwidth. Decreasing the peak deviation from 5 kHz to 2.5 kHz in an FM system is one way to reduce the bandwidth of the transmitted signal in order to create more communication channels. New communication channels are becoming available at higher frequencies. Thus, the likelihood of having smaller deviation systems which operate at higher frequencies makes the audio disturbances associated with Rayleigh fading a significant problem.

Various noise reduction techniques have been used to control noise bursts and reduce the overall noise level in FM radio systems. Syllabic companding, high frequency equalization, automatic gain control (AGC) circuits, noise blankers, space-diversity receivers, and various other noise reduction techniques are known. However, several unique problems arise in the implementation of techniques compatible with the audio disturbances associated with a Rayleigh-faded signal in a FM receiver—especially FM systems utilizing a peak deviation of less than 5 kHz. Moreover, there is often the requirement that any noise reduction technique used in commercial FM systems must be compatible with existing radios. For example, conventional syllabic companding, i.e., transmitter-compression and receiver-expansion, cannot be retrofit into many existing systems. More particularly, any noise reduction implementation requiring an IF envelope or received signal strength indicator (RSSI) signal cannot be added to many existing radios not providing these signals. As a further complication, FM simulcast systems present the unique requirement that the noise reduction system be transparent to both high-speed and low-speed signalling and/or coded squelch data which is sent simultaneously with the voice.

A need, therefore, exists to provide an improved audio noise reduction technique which is compatible with existing FM communication systems.

SUMMARY OF THE INVENTION

Accordingly, it is a general object of the present invention to provide an improved FM communications system which produces a higher quality audio output under poor signal-to-noise and Rayleigh fading conditions.

Another object of the present invention is to provide a method and means for minimizing noise burst problems associated with weak and Rayleigh-faded signals in FM communication receivers.

A further object of the present invention is to provide an FM receiver with improved audio quality output under adverse noise and fading conditions, which is compatible with systems requiring simultaneous transmission of low-speed data.

This invention is especially, but not exclusively suited for minimizing noise bursts under weak RF signal conditions in an FM system utilizing a peak deviation of less than 5 kHz, and for implementation in an FM receiver regardless of whether an RSSI signal is available.

These and other objects are achieved by the present invention which, briefly described, is an FM communications system incorporating various embodiments of the following noise reduction techniques: an FM receiver having improved audio response to weak and Rayleigh-faded received FM signals; an improved noise attenuation device having dual-thresholds to more effectively attenuate low level noise; an improved automatic gain control circuit which enhances the operation of the noise attenuation device; and a noise attenuation device adapted for use in simulcast FM repeater systems transmitting low-speed data.

The present invention minimizes Rayleigh generated noise pops by using a controllable attenuator in series with the audio output, i.e., between the discriminator and speaker. The amount of attenuation is controlled by a control signal which corresponds to the magnitude of the received signal for signal levels which are below a given clipping level and is a constant when the received signal magnitude is above the given clipping level. Significant Rayleigh fades will cause the control signal amplitude to decrease below the clipping level. This causes the amount of attenuation to increase the amplitude of the received signal decreases below the clipping level. The increased attenuation results in lower audio output and thus mutes the magnitude of the pop generated during the fade. A suitable choice for the clipping level has been found to be 5-20 dB below the average magnitude of the received signal with 10-15 dB being preferred.

Preferably the control signal includes another component signal which is utilized only during received signal conditions where low signal-to-noise ratios exists. This component signal is derived by peak detecting only the high frequency signal components of the amplified IF signal which correspond to noise so that the peak detection does not respond to desired audio frequencies. Since the magnitude of such high frequencies are low except at threshold signal conditions, the additional component to the control signal does not normally contribute except at such threshold conditions where it augments the control signal so as to provide additional muting by the attenuator. It has been found that this additional muting contributes to the intelligibility of marginal signals at threshold conditions by reducing the prominent noise content.

The FM receiver according to the present invention comprises a receiver for receiving the FM signal, including a discriminator for converting the FM into a baseband signal containing both in-band audio components and above-band noise components; and a noise reduction circuit for minimizing noise bursts in the in-band audio components of the baseband signal in response to the average value of the above-band noise components from the discriminator, thereby producing noise-minimized audio signals, where the noise reduction circuit operates only when the signal-to-noise ratio (SNR) of the received FM signal is less than a predetermined SNR. The noise reduction circuit includes a circuit for generating a noise control signal which is proportional to the average value of the high frequency discriminator noise, a circuit for generating an attenuation control signal in response to the noise control signal, and a variable attenuator in series with the audio to attenuate the audio in response to the attenuation control signal. In another embodiment, the noise control signal is proportional to the strength of the received FM signal. In still a third embodiment, the attenuation control signal is proportional to both high frequency discriminator noise and RF signal strength.

The FM receiver also includes a noise attenuation circuit for selectively attenuating received audio signals having a low audio level. An improvement to the noise attenuation circuit changes its attenuation characteristics below a first predetermined input level to approximately 2:1 output/input amplitude response, and to at least a 3:1 response below a second predetermined input level, to enhance the noise suppression characteristics of the device without significantly affecting the audio quality.

A further improvement to the noise reduction techniques includes a "speech-controlled AGC" circuit to control the amplitude of the audio signal applied to the noise attenuator. The AGC must be able to distinguish between a noise burst and voice signals, and must not produce erroneous detection under Rayleigh fading conditions.

In the preferred embodiment of an 800 MHz FM mobile radio simulcast repeater system, the combination of the noise reduction circuit and noise attenuation circuit according to the present invention provides a substantial audio quality improvement. A further improvement to the noise attenuation circuit permits its use in a simulcast system in which continuous low speed data is transmitted with the voice signal by adding a complementary attenuation path to keep the low speed data output at a constant value.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like-referenced numerals identify like elements, and in which:

FIG. 11 is a block diagram of an FM transmitter in which companding is used;

FIG. 12 illustrates an FM receiver for receiving a companded signal;

FIG. 13 is a partial block diagram of an FM receiver for receiving a companded signal which incorporates noise reduction in accordance with the present invention.

FIG. 22 is a block diagram of the simulcast noise attenuation device used for blocks 256 & 274 of FIG. 21;

DETAILED DESCRIPTION OF THE PREFERRED EMBODIMENT

Figure 1:
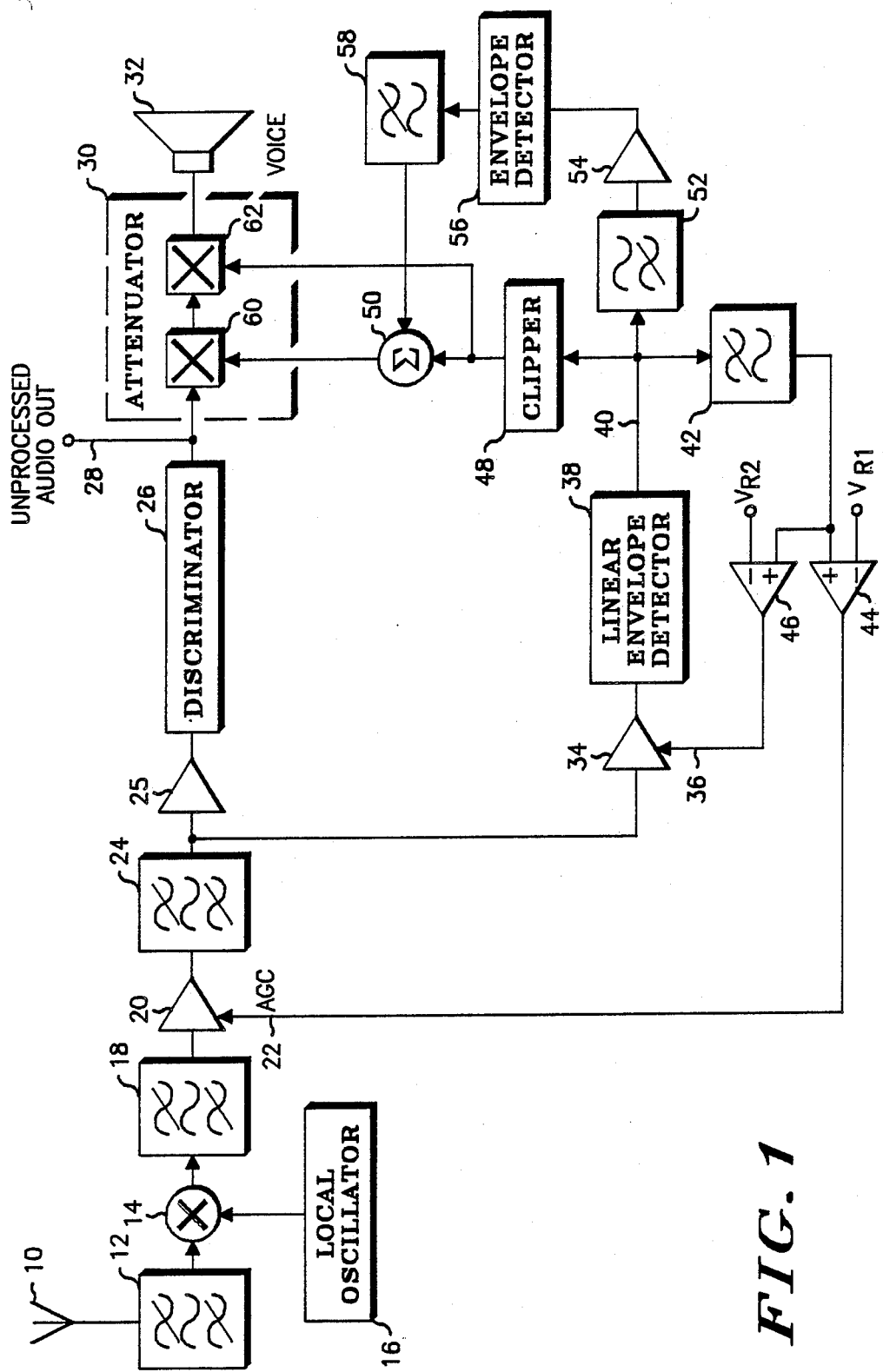
FIG. 1 is a block diagram illustrating an improved FM receiver according to the present invention.

FIG. 1 illustrates an improved FM receiver in accordance with the present invention. Antenna 10 couples signals to bandpass filter 12 which couples the filtered signals to mixer 14. The output of local oscillator 16 provides the other input to mixer 14 which has its output coupled via bandpass filter 18 to IF amplifier 20. The gain of amplifier 20 is controlled by means of an input 22. The output of amplifier 20 is coupled through bandpass filter 24 to amplifier 25 which further amplifies and limits the signal before it is coupled to discriminator 26. The unprocessed baseband audio output 28 from the discriminator can be used to provide a squelch signal to a conventional squelch circuit or an output to a digital signal demodulator, and also provides an input to attenuator 30. The output of the attenuator provides a voice output which can be coupled to a speaker 32. It will be apparent to those skilled in the art that the output of the attenuator can also be amplified by an audio amplifier (not shown) rather than directly driving speaker 32.

The output of bandpass filter 24 is also coupled to an amplifier 34 which preferably has its gain controlled means of an input 36. The output of amplifier 34 is coupled to a linear envelope detector 38 which detects the peak magnitude of its input signal. The output 40 of the detector is coupled to a lowpass filter 42 which has its output coupled to amplifiers 44 and 46. These amplifiers function as comparators and provide outputs when the input from lowpass filter 42 exceeds VR1 and VR2, respectively. The output from amplifier 46 serves as the input 36 to control the gain of amplifier 34. The output of amplifier 44 provides the input 22 to control the gain of amplifier 20.

The output 40 from envelope detector 38 is also coupled to a clipper 48 which has a selected voltage level at which clipping begins so that its output, which is coupled to summation network 50, is limited to a predetermined value even if the input continues to increase. The output 40 is also coupled to a highpass filter 52 which highpass filters the signal and couples same to amplifier 54 which amplifies the signal and provides an input to envelope detector 56. The detector detects the peak envelope of the magnitude of the signal from amplifier 54. The detector's output is smoothed by a lowpass filter 58 which may consist of a RC time constant circuit which has its output coupled as an input to summation network 50. The output of summation network 50 provides an input to attenuator stage 60 which attenuates the magnitude of the audio signal in response to the control signal provided from the network 50. The output of stage 60 is coupled to the input of attenuator stage 62 which also has its attenuation controlled in response to an input provided from clipper 48. The output of stage 62 consists of the audio output.

It will be apparent to those having skill in the art that elements 10–28 are a standard FM receiver circuits with the exception that the IF gain associated with amplifier 20 is controlled by an automatic gain control (AGC) circuit. The AGC circuitry consists of elements 34, 38, 42, 44, 46 and 20. The purpose of the AGC circuitry is to control the gain of amplifiers 34 and 20 by means of the output of amplifiers 46 and 44 to keep amplifiers 34 and 20 operating in a linear region for all magnitudes of input signals.

Figure 4:
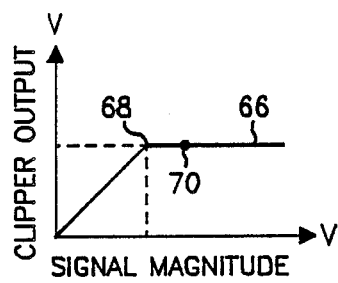
FIG. 4 is a graph which illustrates the output of the clipper versus signal magnitude of the embodiment of FIG. 1.

FIG. 4 illustrates the transfer characteristic of clipper 48 by the solid line 66. The response curve 66 has a so-called "knee" 68 so that the clipper output is a constant level for input signal levels greater than that corresponding to the knee.

The clipping action provided by clipper 48 is important to the present invention. The point indicated by numeral 70 in FIG. 4 represents the operational point of the clipper for a preferred predetermined limiting level such as at 15 dB. The time constant associated with lowpass filter 42 is such that the AGC control signals 22 and 36 do not respond rapidly enough to follow a typical Rayleigh fade. The purpose of the AGC is to follow the average input signal magnitude (strength) and thereby control the gain for slowly changing signal conditions which are much longer in duration than Rayleigh fades. Thus, a time constant associated with filter 42 could be on the order of one second for UHF radio systems where Rayleigh fades have time durations on the order of a few milliseconds. The significance of the operational point 70 as shown in FIG. 4 is that a Rayleigh fade of significant magnitude will cause the clipper output to fall below the knee 68 for part of the duration of the fade and hence increase the attenuation by attenuator 30 during this time.

Figure 5:
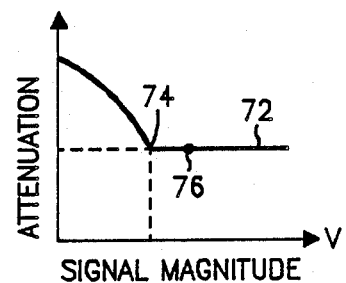
FIG. 5 is a graph illustrating the amount of attenuation provided in response to the signal magnitude embodiment of FIGS. 1 and 2.

FIG. 5 illustrates the attenuation provided by attenuator 30 as a function of the output of clipper 48. Each attenuation stage may consist of an operation transconductance amplifier such as a CA3280E. The curve 72 illustrates that the attenuation characteristic exhibits a knee 74 which corresponds to knee 68. For clipper inputs greater than the level at the knee 74, the attenuation is a constant. At clipper outputs below knee 74 the attenuation is inversely proportional to the square of the clipper output, that is, attenuation increases at a greater than linear rate as the clipper output decreases. Preferably the ratio X/Y is greater than 1, where X is the increase in attenuation that corresponds to a Y decrease in received signal strength. This characteristic is due to the two cascaded attenuator stages 60 and 62 each having its attenuation controlled in response to the clipper output. The operational point 70 in FIG. 4 corresponds to operational point 76 in FIG. 5. Thus, during a fade as the operational point moves below knee 68 on curve 66 and to the left of knee 74 on curve 72, it will be apparent that increasing attenuation is provided which mutes or reduces the audio gain thereby minimizing noise bursts or pops corresponding to the Rayleigh fade.

If attenuator 30 had only a single attenuator stage, the attenuation characteristic to the left of knee 74 would be linear. While such a single stage attenuator would provide an audio reduction during Rayleigh fading, attenuation increasing at a greater than a linear rate provides a greater rate of muting. It will be apparent to those skilled in the art that more than two attenuation stages or attenuators having a controllable transfer characteristic could be utilized to provide an even greater rate of attenuation below a given knee. However, it will be appreciated that a complete or total muting of the audio during the fade may be perceived by the listener to be as objectionable as a noise burst. Therefore, an empirical determination of the best rate of attenuation can be selected based upon a subjective evaluation of the audio output.

In narrow deviation FM systems, i.e., below 5 kHz peak deviation, it is desirable at threshold or low signal-to-noise conditions to provide additional muting. Elements 52-58 provide an implementation to accomplish this function. Highpass filter 52 passes the high frequency or noise content above the audio range which is amplified by amplifier 54 before being peak detected by detector 56. It will be noted that the amount and presence of the higher frequency noise increases rapidly near threshold conditions. Time constant 58 is preferably selected to be on the order of a few milliseconds so that rapid fluctuations with respect to the noise content can be followed. Attenuation is provided by means of attenuation stage 60. This type of attenuation functions for very low level received signals such as approximately 12 dB SINAD or below because moderate and strong signal levels have little high frequency noise content. This enhances the ability of a listener to attempt to understand low level signals by providing audio attenuation which tracks rapidly changing noise levels as opposed to an average signal level.

Figure 3:
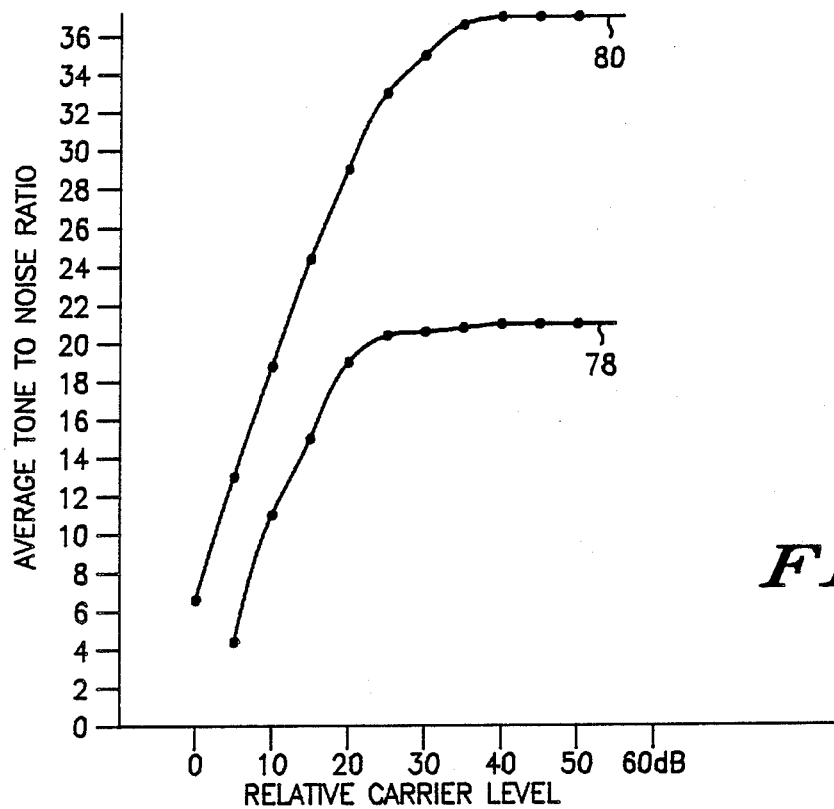
FIG. 3 is a graph illustrating the variation in average tone-to-noise ratio as a function of carrier level for an FM receiver employing the concepts of the present invention and for a conventional FM receiver.

FIG. 3 is a graph which visually illustrates an improved audio response achieved by the present invention in response to Rayleigh-faded received signals. The graph shows the average tone-to-noise ratio versus relative carrier level for a conventional full limiting FM receiver by curve 78 and for an FM receiver embodying the concepts of the present invention by curve 80. The knee of curve 78 occurs at an average tone-to-noise ratio of approximately 20 and at a relative carrier level of approximately 22 dB. The knee of curve 80 occurs at slightly above an average tone-to-noise ratio of 36 and at a relative carrier level of approximately 35 dB. For relative carrier levels of approximately 15 dB and less, a receiver according to the present invention has an tone-to-noise ratio of approximately 8 dB better than the conventional receiver At a relative carrier level of 40 dB and above, a receiver according to the present invention has an average tone-to-noise ratio of approximately 16 dB greater than that of a conventional radio.

The curves in FIG. 3 represent a 2.5 kHz peak deviation receiver measured at 1.5 kHz peak deviation with a 1 kHz audio tone modulation. Simulated Rayleigh fading having a maximum Doppler frequency of approximately 54 Hz was utilized to simulate the fading which might be encountered by a vehicle travelling at approximately 40 miles per hour while receiving a signal at 900 MHz.

The curves presented in FIG. 3 are intended to merely provide a visual representation of the improved audio response achieved by utilization of the present invention. While FIG. 3 does illustrate the benefits of the present invention, it is difficult to fully represent the subjective improvement in audio quality and listening comfort achieved by the present invention by purely visual means.

Figure 2:
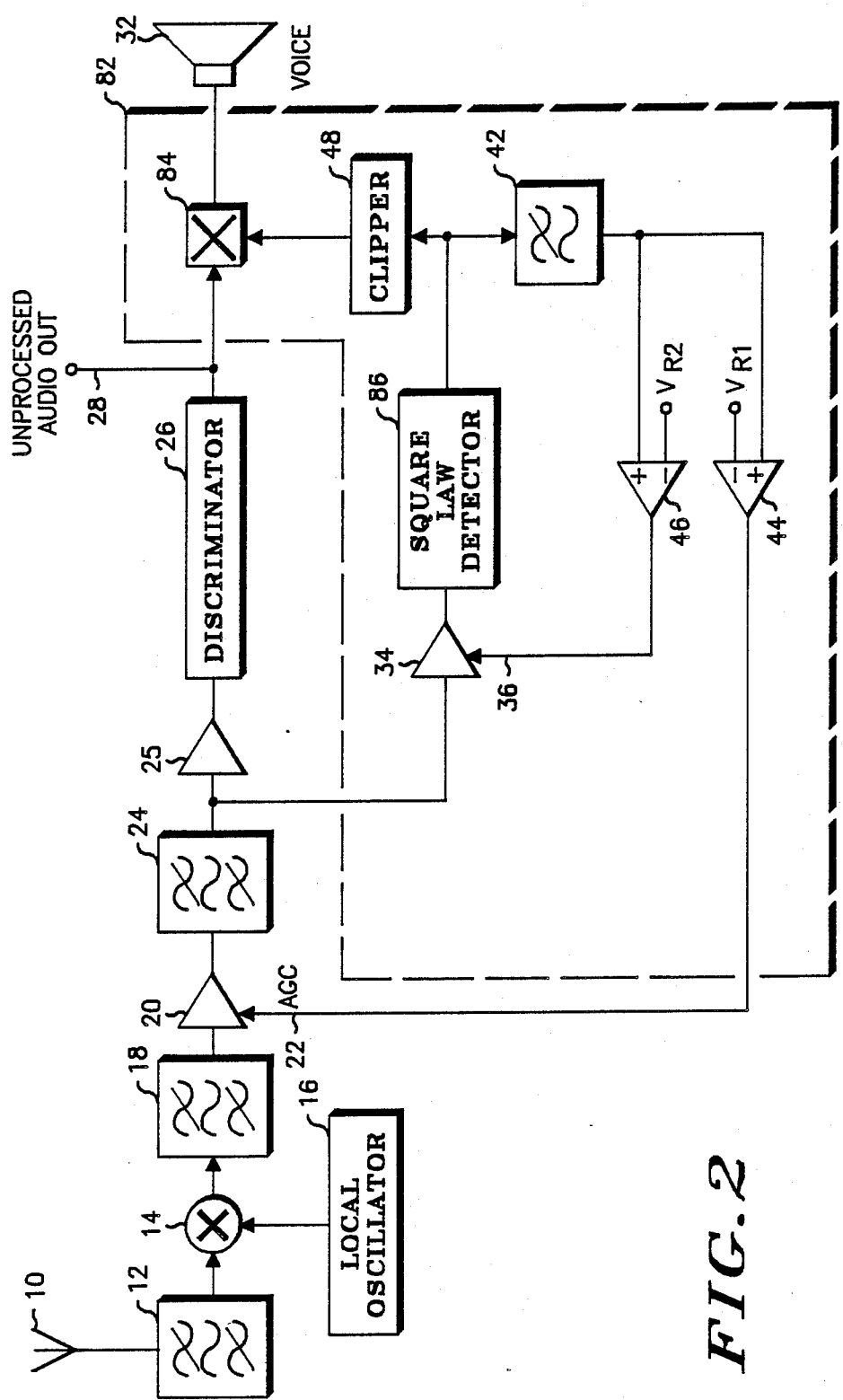
FIG. 2 is a block diagram of an alternative embodiment of an improved receiver according to the present invention.

FIG. 2 illustrates an FM receiver in which the concept of the present invention is implemented by a different embodiment. It should be noted that many of the same elements referenced in FIG. 1 are also present in the diagram shown in FIG. 2.

The embodiment in FIG. 2 illustrates that additional circuitry 82 could be added to a conventional FM receiver to achieve the improved results of the present invention. A single attenuation stage 84 is utilized instead of the two stages 60 and 62 as shown in FIG. 1. A square law detector 86 is utilized instead of the linear detector 38. Detector 86 has a square law transfer characteristic instead of a linear transfer function. For example, a properly biased diode could be utilized as the detector 86. The general purpose of the detector 86 is similar to that of detector 38, that is, it follows the peak magnitude envelope of the amplified input signal except that it has a square law transfer function.

Figure 6:
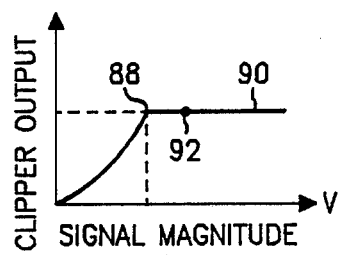
FIG. 6 is a graph illustrating the output of the clipper versus signal magnitude of the embodiment shown in FIG. 2.

FIG. 6 illustrates the output of clipper 48 as embodied in circuitry 82 versus the signal magnitude. It should be noted that below the knee 88 on curve 90 the response is a square law response representing the output of detector 86. Above the clipper input voltage corresponding to knee 88, the clipper output is a constant. Point 92 as shown on curve 90 represents operation at a preferred clipping level such as 15 dB of clipping. During a Rayleigh fade in which the received signal magnitude momentarily becomes less than the level of clipping, the clipper's output will decrease. The attenuator stage 84 responds to this change in level by increasing the attenuation thereby decreasing the audio gain during the Rayleigh fade to minimize the objectionable noise burst. For moderate and strong signal level conditions, the receiver shown in FIG. 2 will perform substantially equivalent to the receiver as shown in FIG. 1. In this embodiment detector 86 provides the square law characteristic instead of the two cascaded attenuation stages 60 and 62 of the embodiment shown in FIG. 1. Although the receiver in FIG. 2 does not show additional audio muting due to low level received signals near threshold, it will be apparent that elements 50, 52, 54, 56 and 58 could also be utilized with the embodiment as shown in FIG. 2.

Lowpass filter 42 and amplifiers 46 and 44 derive AGC signals that are coupled to inputs 36 and 22 of amplifiers 34 and 20 to maintain the amplifiers in a linear region for various average input signal levels. The time constant associated with this AGC action is substantially longer than the duration of a Rayleigh fade, such as approximately one second.

Figure 7:
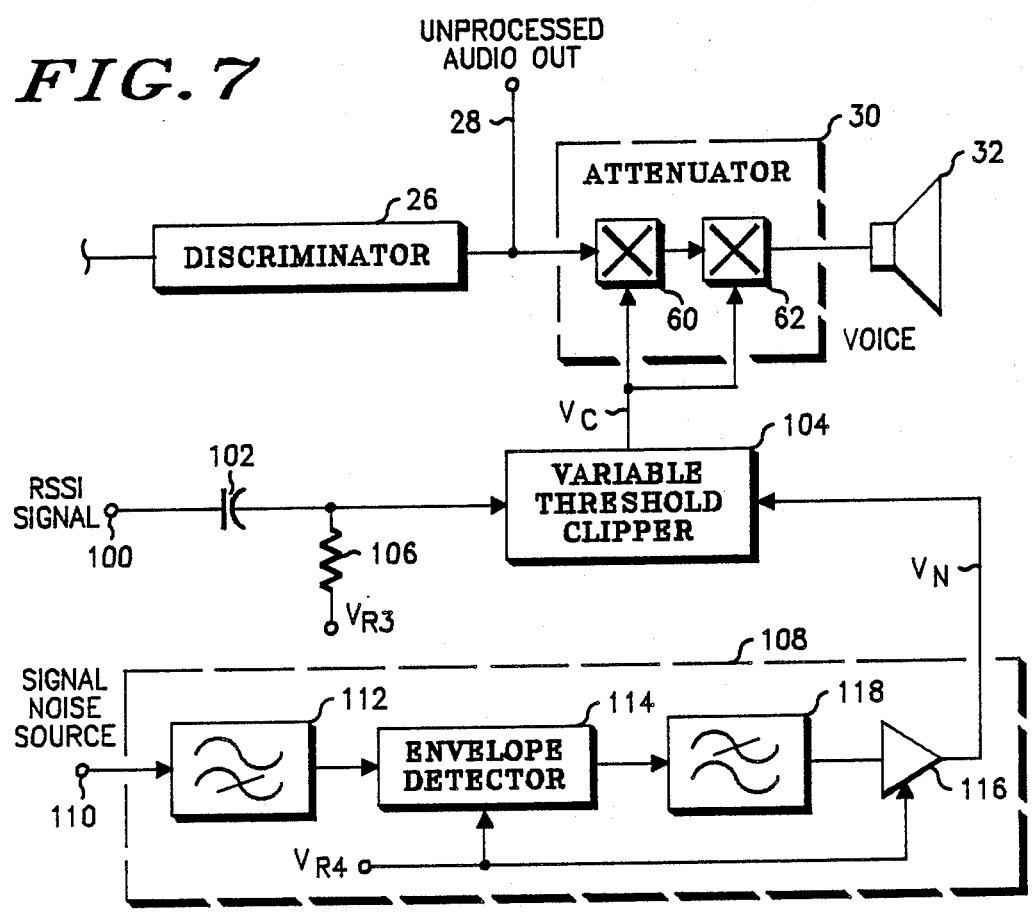
FIG. 7 is a block diagram of another embodiment of the present invention which utilizes a received signal strength indicator (RSSI) signal.

FIG. 7 illustrates another embodiment of the present invention utilized with a conventional FM receiver. Discriminator 26, attenuator 30 and speaker 32 operate in the same manner as previously described with respect to the embodiment shown in FIG. 1.

A received signal strength indicator (RSSI) signal is provided at terminal 100 and is coupled through capacitor 102 to a variable threshold clipper 104. The generation of RSSI signals is well known. For example, FM receivers used in cellular telephone mobile radios generate an RSSI signal. The RSSI signal is preferably proportional to the mathematical log of the magnitude of the received signal in order to compress large signal level variations into a smaller range of RSSI signals.

A DC bias voltage VR3 is summed with the AC coupled RSSI signal through resistor 106. The magnitude of voltage VR3 sets the threshold level at which clipper 104 begins to clip. The RC time constant of resistor 106 and capacitor 102 is selected so that only the relatively rapid Rayleigh fades reflected in the RSSI signal are coupled to clipper 104. The functioning of clipper 104 will be further described below.

A circuit 108 receives a source of signal noise at terminal 110 and provides an output signal voltage $V_N$ which is proportional to the amplitude of noise being received. The unprocessed audio output 28 from discriminator 26 may be used as the noise source. The circuit 108 includes a highpass filter 112, an envelope detector 114, a lowpass filter 118, and an amplifier 116. The envelope detector and amplifier are biased by a reference voltage VR4. The highpass filter 112 filters out audio frequencies and passes higher frequencies. These higher frequency signals are envelope or amplitude detected by detector 114 whose output is lowpass filtered by filter 118 and amplified by 116. The voltage VR4 provides a reference which corresponds to the magnitude at which noise signals will be detected and amplified by detector 114 and amplifier 116. An output $V_N$ of circuit 108 is provided only during low signal to noise conditions. The purpose of output $V_N$ is to provide additional attenuation of the audio output during weak signal levels. This action results in a more pleasing audio output as the audio message grows weaker relative to the noise level.

Figure 8:
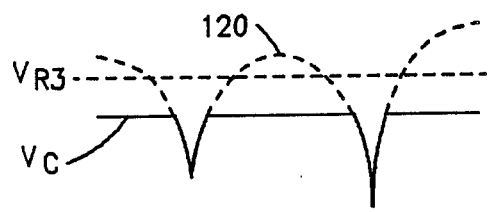
FIG. 8 is a graph which illustrates waveforms associated with the embodiment shown in FIG. 7.

FIG. 8 is a composite graph showing three waveforms: reference DC level VR3, waveform 120 which corresponds to the magnitude of the received signal as determined by the RSSI, and waveform VC (shown in solid line) from clipper 104 which controls the amount of attenuation to be provided by attenuator 30. It should be understood that waveform VC is superimposed over portions of waveform 120. The portions of waveform 120 which coincide with signal $V_C$ illustrate Rayleigh fading nulls which have a magnitude sufficient to cause attenuation to be provided by attenuator 30. Bias voltage VR3 is preferably selected so that Rayleigh fades having a level 5–20 dB below the average magnitude of the received signal will cause attenuation of the audio output. The magnitude at which attenuation is provided is illustrated graphically in FIG. 8. The portion of waveform 120 above waveform $V_C$ represents signal levels above the attenuation threshold; the threshold corresponds to the straight horizontal line portion of waveform $V_C$.

Figure 9:
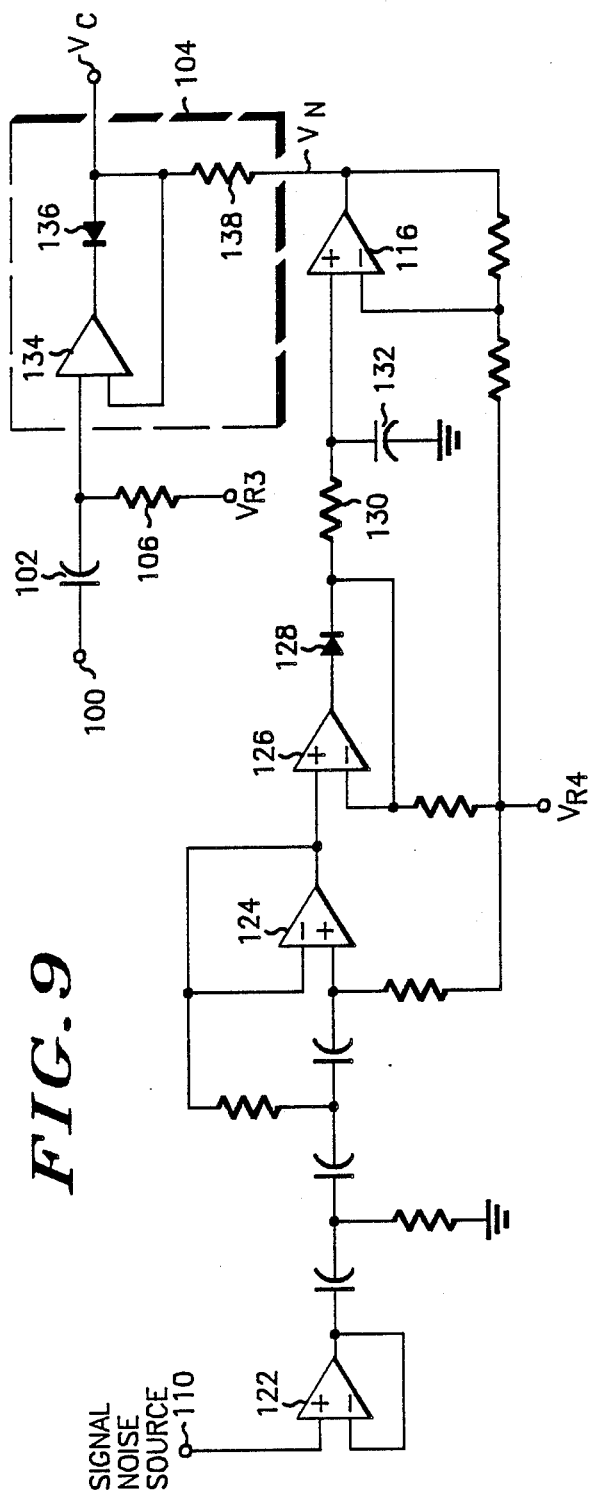
FIG. 9 is a schematic diagram illustrating selective portions of the invention as shown in FIG. 7.

The schematic diagram in FIG. 9 illustrates a particular embodiment of circuit 108 and clipper 104. Amplifiers 122 and 124 and the associated capacitors and resistors comprise highpass filter 112. Amplifier 126 and diode 128 comprise envelope detector 114; resistor 130 and capacitor 132 comprise lowpass filter 118.

The variable clipper circuit 104 comprises an amplifier 134 whose output is clipped by diode 136. The control signal $V_N$ is summed through resistor 138 with the output $V_C$ to provide additional attenuation during low signal level conditions.

A conventional FM receiver can incorporate the embodiment of the present invention as illustrated in FIGS. 7–9 without modification of the other receiver circuitry. For example, there is no requirement for automatic gain control of intermediate frequency amplifiers. Thus, this embodiment of the present invention can be easily added to existing FM receivers.

It is preferred that attenuator 30 in the embodiment illustrated in FIG. 7 provide the same attenuation characteristics as previously described. That is, the attenuation provided when the received signal falls below the predetermined threshold is preferably greater than one dB of attenuation for one dB in reduced signal strength; a two dB increase in attenuation for one dB loss in signal strength has proved satisfactory. With the two attenuator stages 60 and 62 in series, a signal $V_C$ corresponding to a linear change of received signal strength would provide the 2:1 attenuation change assuming each attenuation stage contributes one dB of attenuation. However, if the RSSI signal corresponds to a logarithmic variation of the received signal strength, the rate at which the attenuation will change varies with the signal strength. An attenuation change of approximately 2:1 can be achieved despite the logarithmic response of the RSSI by making an appropriate choice of the bias voltage VR3.

Figure 10:
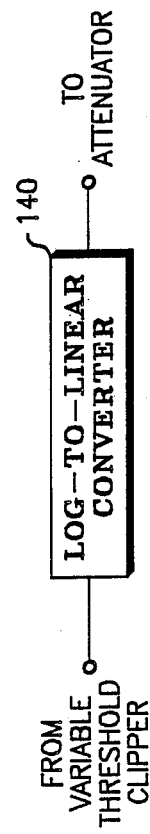
FIG. 10 illustrates a log-to-linear converter which is used in a modified embodiment of the invention as shown in FIG. 7.

FIG. 10 illustrates a log-to-linear converter 140 which can be utilized with the embodiment of the present invention as shown in FIG. 7 by connecting the output of the clipper 104 to its input and connecting its output to attenuator 30. By providing a logarithmic to linear conversion of signal $V_C$ and by operating the clipper 104 and attenuator 30 in a linear region, a logarithmic RSSI signal is compensated for by the converter 140 such that the control signal to attenuator 30 is substantially linear with respect to received signal strength. Thus, an attenuation versus received signal strength variation of 2:1 (during fades below the predetermined threshold) can be precisely achieved. It will also be apparent to those skilled in the art that other ratios of attenuation versus received signal strength can be achieved by varying the control signal applied to attenuator 30. Alternatively, additional series attenuator stages in addition to attenuator 60 and 62 could be utilized to achieve different ratios.

FIGS. 11 and 12 illustrate a typical transmitter and receiver, respectively, in which "syllabic companding" is utilized to improve the effective signal-to-noise ratio. In a communications system using syllabic companding, the amplitude of the voice input signal is compressed by a compressor 142 before FM modulator and transmitter 143, and the receiver 141 utilizes an expandor 144 to expand the received audio amplitude back to its original characteristics. Much of the improvement due to companding in FM communication systems is due to the expansion provided at the receiver. The expandor gain increases during audio envelope maxima and decreases during audio envelope minima. This produces an improvement in the average signal-to-noise ratio of a signal which has a fluctuating amplitude, such as speech, assuming that the amplitude of a noise signal is below the amplitude of the desired received signal. During a Rayleigh fade which produces a noise burst with an amplitude greater than the desired signal, the expandor in the receiver tends to track the increasing noise amplitude and increases the gain of the noise signal. Thus, such fading will "talk up" the expandor in the same manner as a voice signal so as to produce an undesired audio output. This problem is especially apparent when trying to receive a signal having a relatively low signal strength. During such conditions, a Rayleigh fade produces a noise signal output from the FM receiver which has a greater amplitude than the desired signal. This noise signal causes the expandor to increase gain, thereby amplifying the noise burst and producing an audio output which sounds worse than a system without companding.

The partial block diagram of the receiver shown in FIG. 13 illustrates that the prior embodiments of the present invention represented by noise reduction block 146 can be inserted between a conventional discriminator 26 and circuitry 148 which is part of the conventional circuitry utilized in a companding system. It was not readily apparent that the combination of noise reduction circuitry 146 in an FM receiver which utilizes an expandor 144 would provide an improved result. Although the noise reduction circuitry 146 will reduce the noise output of the conventional receiver by reducing the magnitude of the noise pops, it was thought that its use with an expandor might produce an undesirable system in which the expandor would follow the reduced magnitude level produced by the noise reduction circuits during fading and introduce undesirable amplitude fluctuations in the received signal.

Actual testing of the noise reduction circuitry 146 in a companding receiver showed that the overall receiver system did not respond undesirably according to the above prediction. The time duration during which audio attenuation is provided by the noise reduction circuitry for Rayleigh fades is shorter than the normal time constant associated with the expandor 144. For example, a typical time constant of approximately 20 milliseconds associated with an expandor is substantially longer than the typical time intervals of audio muting provided in response to the noise reduction circuitry 146 of the present invention. Thus, the expandor does not follow the brief audio level reductions caused by the noise reduction circuit 146 and hence the expandor does not introduce undesirable amplitude fluctuations in the received signal.

Incorporation of the noise reduction circuitry 146 according to the present invention in a narrow deviation FM system which utilizes companding provides a significant improvement in the quality of received audio signals at all signal levels. The improvement provided by this combination is most apparent at relatively low signal levels where there is a tendency of conventional FM companding receivers to be talked up in response to noise bursts which occur during Rayleigh fades.

In companding systems, the equal gain point—defined as the point of unity gain for the compressor or expandor—should be the same for the compressor as for the expandor when referred to peak deviation. This standardization of gain levels will give the same loudness when changing between linear and companded modes of operation. It is also desirable to set the transmitter compressor equal gain point as high as possible to keep the modulation index high. However, because the compressor is syllabic with a finite attack time, setting the equal gain point too high will result in increased distortion due to clipping of the initial overshoot in the transmitter audio processing. Furthermore, if too much of the initial overshoot is lost in clipping, the expandor will be slow to build up gain at the beginning of syllables.

The receiver expandor also benefits from having a equal gain point set as high as possible. A high expandor equal gain point prevents the expansion of noise at the receiver threshold. A high equal gain point in the expandor also minimizes the upward expansion of audio signals which would require increased dynamic range in the audio power amplifier to prevent clipping.

Nevertheless, many portable radios, and some mobile radios, have limited audio power available in either the receiver audio power amplifier stage or the receiver expandor stage, or both. This lack of dynamic range results in clipping at the audio amplifier output. Moreover, since the louder companded signals are usually in the lower frequency voice range, the limited dynamic range exhibits itself as a "boomy" characteristic, which significantly degrades the audio intelligibility. The intelligibility is degraded even further when pre-emphasis and de-emphasis audio shaping is used, since the higher frequency audio is rolled off at −6 dB/octave in the receiver. Therefore, what is needed is a distortionless means to limit the expandor gain above a certain audio power level.

Figure 14:
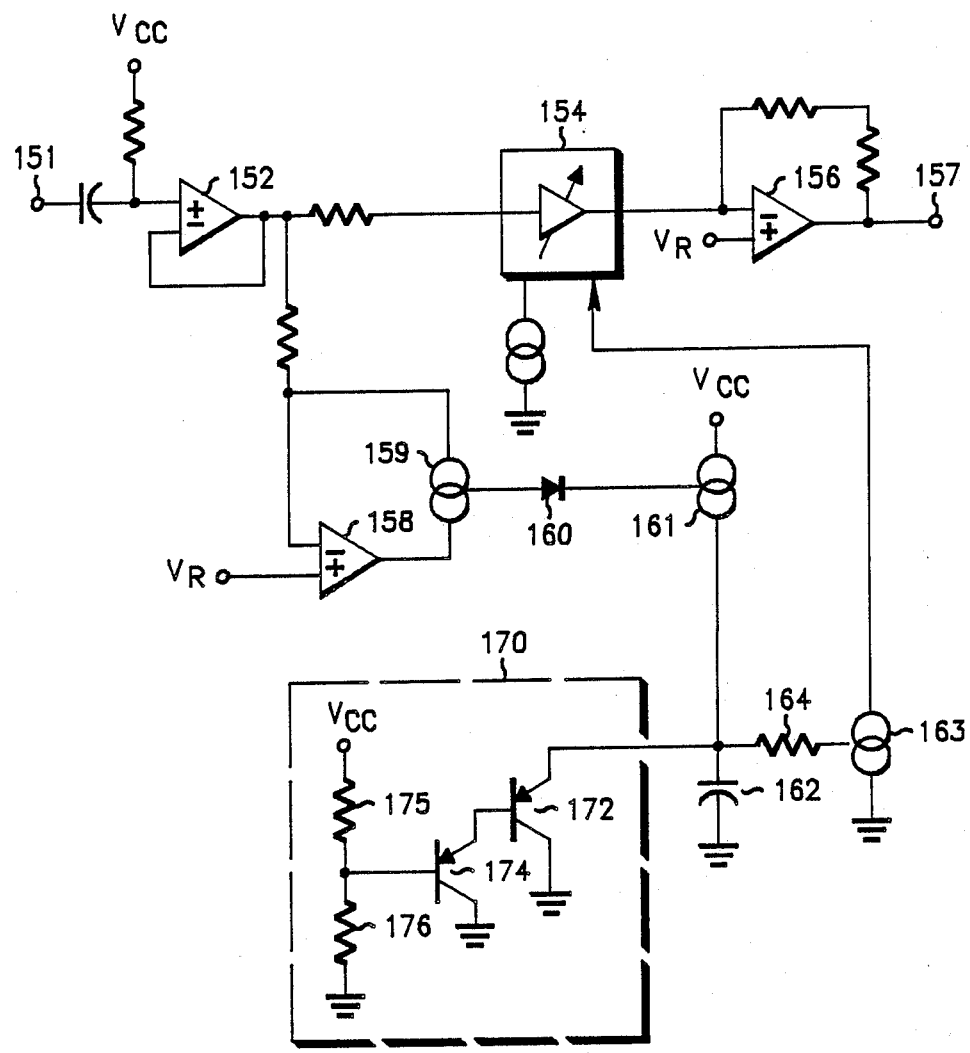
FIG. 14 is a simplified schematic diagram illustrating the improved expandor circuit according to the present invention.

FIG. 14 is a simplified schematic diagram representing an improvement to compandor expandor 144 of FIG. 13. The improvement is the clamp circuit, shown as block 170, which causes the 2:1 expandor gain to change to a constant 1:1 value above a certain value of audio output level. An input signal is applied to node 151, buffered by amplifier 152, and routed to the inputs of both the variable gain stage 154 and the rectifier stage. The output of the variable gain stage is amplified by op amp 156, and the expanded output signal is available at node 157.

The full wave averaging rectifier stage is comprised of op amp 158, current sources 159, 161, and 163, diode 160, resistor 164, and capacitor 162. The input current to the rectifier stage is supplied by the output of op amp 158. Diode 160 performs the full wave rectifier averaging function The output current is averaged by resistor 164 and capacitor 162, which sets the averaging time constant. The output current is then mirrored with a gain of two in current source 163 to become the control current for variable gain stage 154. When the input signal drops by 6 dB, the gain stage control current will drop by a factor of 2, such that the gain will also drop by 6 dB. The output signal at 157 will thus drop 12 dB, producing the desired 2:1 expansion.

Clamp circuit 170 serves to change gain of the expandor so as to produce a linear 1:1 response for input signals above a predetermined level. Since the path for the gain stage controlling current is through R164, the voltage drop across R164 is the gain term being controlled by limiting circuit 170. The voltage drop across R176 is the same as the voltage drop across R164, since the base-emitter voltage of transistors 172 and 174 are approximately the same as those in current source 163. For small signals, the voltage across R164 is small, such that transistors 172 and 174 are not forward biased. Hence, the conventional 2:1 expansion occurs. However, when the voltage drop on resistor 164 exceeds a predetermined level (2.37 volts in the preferred embodiment), then transistors 172 and 174 turn on to shunt additional current supplied by current source 161. This clamping action prevents any further increase in current through R164, and hence, limits the expandor gain at that point.

Figure 15:
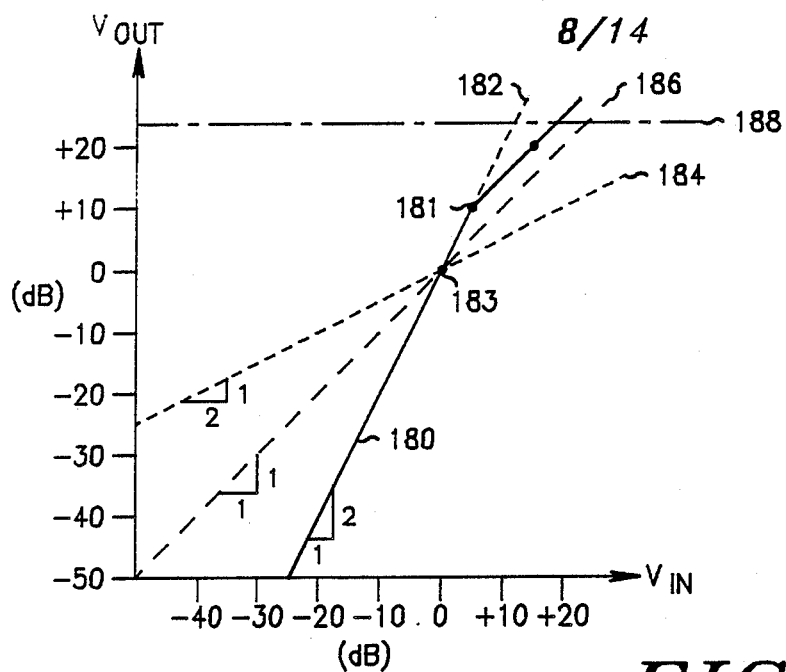
FIG. 15 is a graph illustrating the output of the improved expandor versus the input signal magnitude of the embodiment of FIG. 14.

FIG. 15 illustrates the gain characteristics of the improved expandor circuit of FIG. 14. The horizontal axis represents the input voltage $V_{IN}$ to the expandor, i.e., the voltage available at node 151. The vertical axis represents the output voltage $V_{OUT}$ of the expandor, i.e., at node 157. For reference, a constant 1:1 output/input slope line 186 has been included to more clearly illustrate the gain altering characteristics of the improved expandor. Additionally, a constant 1:2 slope line 184 has also been included to illustrate the compression characteristics of a compandor compressor, such as block 142 of FIG. 11.

A conventional expandor has a constant 2:1 slope, illustrated as line 182 in FIG. 15. Point 183 is the equal gain point, i.e., the point where a 0 dB input produces a 0 dB output. A typical equal gain point would correspond to 50%–60% of full system modulation. Solid line 180 represents the gain characteristic of the improved expandor circuit of the present invention. Gain characteristic 180 follows the conventional 2:1 expandor slope below equal gain point 183, then changes the expandor gain to 1:1 at point 181 having an input level above the equal gain point. In the preferred embodiment, point 181 would correspond to at least 50% of full system modulation, preferably 60%–65%. This change in slope is advantageous to control the upward expansion of audio signals above the equal gain point. As an example of the resulting improvement, a representative audio clip level 188 has been included in FIG. 15 at +25 dB output to illustrate that approximately 7 dB of additional input range can be obtained in this case. Not only does the improved expandor circuit increase the dynamic range as illustrated, but it also does so without adversely affecting the audio quality of the companding system.

As previously mentioned in conjunction with FIG. 13, noise reduction circuitry 146 reduces the magnitude of the noise pops and bursts without degrading the operation of expandor 144. The use of the noise reduction circuit of the present invention provides a significant improvement in the received audio quality at all signal levels. Noise reduction block 146 is preferably constructed as shown in FIG. 7 utilizing both the RSSI-derived attenuation signal and the discriminator noise-derived attenuation signal. Due to practical considerations involving the design of RSSI circuits, it is common for the IF-RSSI signal level to diminish under weak signal conditions. However, the discriminator output noise increases very rapidly for IF C/N less than 10 dB, so it is particularly important to provide some attenuation of the audio when the IF signal level is weak. There may also be some circumstances in which the RSSI circuits are not incorporated into the radio design, or are unavailable for some other reason. Thus, it is often necessary under these conditions to provide an attenuation control signal which is not derived from the RSSI.

Figure 16:
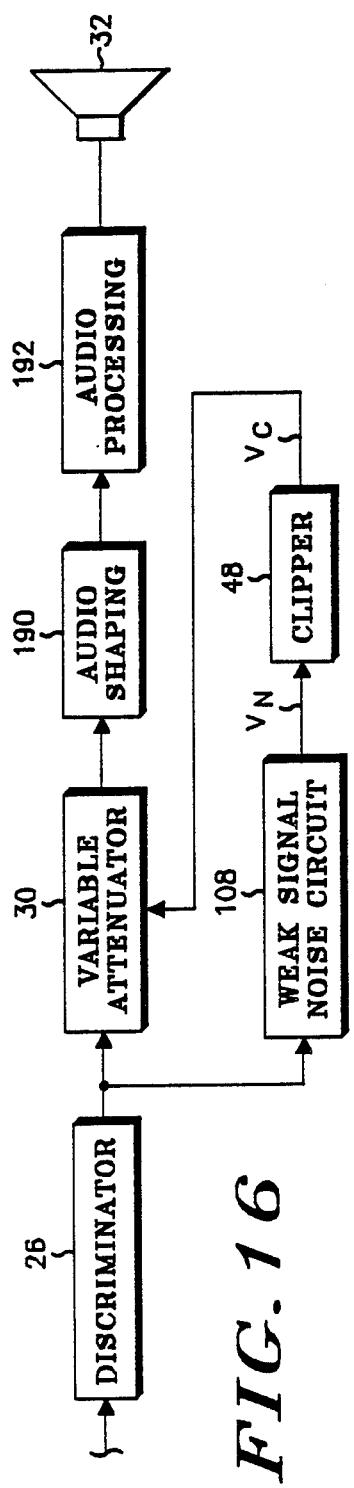
FIG. 16 is a partial block diagram of an FM receiver incorporating the weak signal noise reduction technique in accordance with the present invention.

FIG. 16 illustrates a partial block diagram of an FM receiver incorporating only the discriminator noise-derived noise reduction elements. Discriminator 26, variable attenuator 30, weak signal noise circuit 108, and speaker 32 operate in the same manner as previously described with respect to the embodiment shown in FIG. 7. Audio shaping block 190 may include filtering circuitry such as a receiver de-emphasis network. Audio processing block 192 would include compandor expandor 144 in a companding system, or may comprise additional audio processing circuitry such as audio noise suppression or AGC.

The unprocessed baseband signal output of discriminator 26 contains both in-band speech signals, i.e., 300 Hz to 3 kHz, as well as above-band noise, i.e., frequencies above 3 kHz. The output signal $V_N$ of weak signal noise circuit 108 corresponds to the magnitude of the noise envelope above the audio band. This average value of noise begins to increase rapidly in an IF C/N of approximately 10 dB, and continues to change until the IF C/N is below 0 dB. The rate at which the magnitude of noise changes and the particular IF C/N at which it begins to change depends somewhat on the particular noise frequency band that is selected. In general, the noise behavior is determined by natural laws which govern the process of frequency detection. The rate at which noise output signal $V_N$ changes can be varied by selecting the gain of circuit 108, but this will also affect the particular IF C/N at which the attenuation begins.

If the gain of circuit 108 is too low, the noise output signal $V_N$ will change very little at weak signal levels, such that the discriminator signal will not be attenuated significantly. A burst of noise which is produced by the discriminator when a weak, Rayleigh-faded signal is received will then be heard by the listener. If the gain of circuit 108 is too high, $V_N$ will cut off the attenuator as soon as any noise is produced by the discriminator. Since this occurs when the signal is still intelligible, the attenuator will "chop up" the voice signal and suppress significant message information in an undesirable and annoying manner. Accordingly, there exists an optimum value for the gain of circuit 108, which has been experimentally found to be that which produces a reduction of 5 to 15 dB (8 to 10 dB is preferred) in the magnitude of the audio signal level when no FM signal is being received.

The operation of weak signal noise reduction circuit 108 may be improved by clipping the noise output signal $V_N$ such that the attenuation control signal $V_C$ will not change until the IF C/N falls below some preset level, i.e., 4–10 dB C/N. Clipper 48 performs this attenuation threshold function. In this manner, audio signal levels are unaffected by attenuator 30 until they have reached the threshold of intelligibility. In the preferred embodiment, such a clipping threshold is set near the FM noise threshold of the receiver, which, in the preferred embodiment, corresponds to an in-band audio signal-to-noise ratio (SNR) of approximately 12 dB SINAD (S+N+D/N+D).

As we have seen, attenuator control signal $V_C$ for the noise reduction circuits of the present invention may be derived from the IF envelope, from discriminator noise at frequencies above 3 kHz, or from a combination of both signals. If the noise reduction is to be used with existing receivers which do not incorporate a means of sensing the IF envelope, then the control signal $V_C$ must be derived solely from discriminator noise. The addition of only the weak signal noise reduction block to a companding system still results in a significant and unexpected improvement.

However, there is often the requirement in commercial FM systems that any noise reduction technique be compatible with existing radios. For example, it may not be feasible to retrofit transmitter compression and receiver expansion as part of the noise reduction technique into an existing system. However, it is still possible to obtain some of the noise reduction properties of a full companding system without compression at the transmit end by using alternative noise reduction techniques of the present invention.

Without full companding, and without the availability of an RSSI signal, the weak signal noise reduction technique shown in FIG. 16 may still be employed as a feedforward gain control to attenuate the speech signal momentarily when a burst of noise occurs in the output of the discriminator. Moreover, it has been found that a significant improvement in audio quality may be obtained through the use of an additional feedforward gain control stage located in audio processing block 192. An appropriate circuit would be a speech operated noise attenuation device (SONAD) as known in the art. SONAD does not alter the amplitude of speech having high signal levels, but significantly diminishes the amplitude of low-level noise and weak speech signals.

A SONAD is a modified syllabic expandor in which the control signal is clipped so as to prevent the attenuator from acting on high amplitude signals. Moreover, unlike an expandor, the speech level detector of a SONAD has a faster response time to signals which increase in level than it does to signals which decrease in level. An improvement in the average signal-to-signal noise of speech signals is possible with a SONAD, because its attenuator will diminish the amplitude of noise which occurs during the frequent pauses between syllables and words in speech, without altering the level of the higher amplitude portions of the speech. Distortion is minimized by choosing an appropriate level at which the attenuator begins to act, and by choosing an appropriate time constant associated with the control signal.

Known SONAD circuits produce a very unnatural sounding suppression of the background noise when operated under weak signal conditions. This is due to the fast change in attenuation, which produces a dramatic contrast between no attenuation and full attenuation. Such behavior is inevitable, since a single threshold point is used in order to achieve the desired degree of noise suppression.

Figure 17:
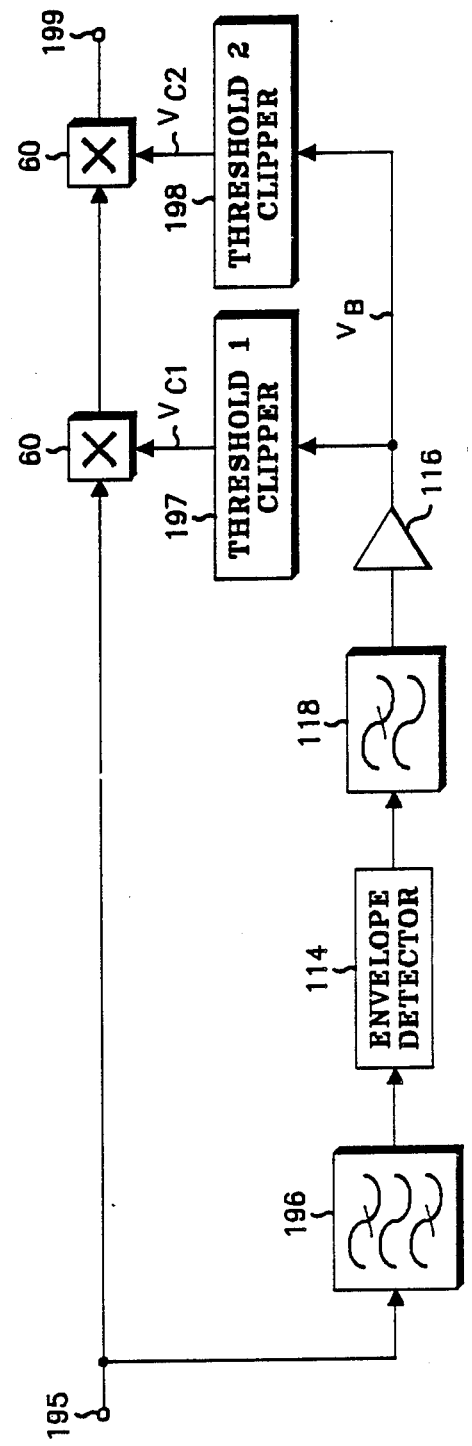
FIG. 17 is an improved noise attenuation device for use in audio processing stage 192 of FIG. 16.

FIG. 17 illustrates an improved SONAD circuit for use in audio processing stage 192 of FIG. 16. The circuit of FIG. 17 avoids the aforementioned problems by employing two attenuators in tandem, each having a different threshold point. In operation, the audio signal from audio shaping network 190 is applied to input node 195. Bandpass filter 196 receives the unprocessed audio, and restricts the audio frequencies to those of speech, i.e., 300 Hz–3 kHz. If audio shaping network 190 includes a de-emphasis network, then bandpass filter 196 may be omitted. The in-band audio frequency signals are full-wave rectified and amplitude detected by envelope detector 114, whose output is low pass filtered by filter 118, and amplified by amplifier 116. The detected speech control signal $V_B$ is applied to threshold 1 clipper 197 as well as threshold 2 clipper 198. The two separate threshold points produce two individual attenuation control signals $V_{C1}$ and $V_{C2}$, respectively, for use by the two attenuators 60. The noise attenuated speech is then provided at output node 199.

Figure 18:
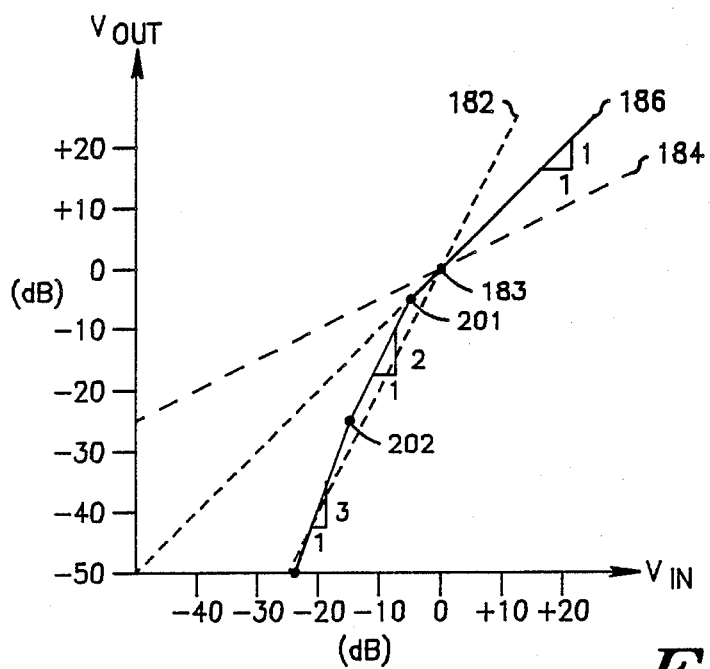
FIG. 18 is a graph illustrating the input/output characteristics of the improved noise attenuation device of FIG. 17.

The graph of FIG. 18 illustrates the input/output characteristics of the improved noise attenuation device of FIG. 17. The 1:2 compression line 184, the 1:1 non-companding line 186, and the 2:1 expansion line 182 have been shown for reference, as well as equal gain point 183. The attenuation characteristic 200 of the improved noise attenuation device follows the 1:1 non-companding response for strong signals. At weaker input signals corresponding to 50% full system modulation or less, clipper threshold 1, represented by "knee" 201, is reached and the device then follows a 2:1 expandor curve. As the input level is lowered further, i.e., to less than 15% full system modulation, clipper threshold 2 is reached at knee 202, wherein the device changes to a 3:1 attenuation characteristic. Hence, the attenuation changes more rapidly as the input signal level is reduced. This improved attenuator characteristic minimizes speech distortion, since only the lower level speech sounds are significantly attenuated without affecting the higher level speech sounds. Furthermore, the use of separate threshold points more effectively reduces the noise between syllables to produce more natural sounding speech.

Although the combination of weak signal noise reduction and dual-threshold SONAD lacks the noise reduction benefits of transmitter compression and the high-dynamic range advantage of strong signal noise reduction, it still provides a dramatic signal-to-noise ratio improvement This improvement is especially important in 800 MHz FM systems where compatibility and retrofit capability are significant issues. Moreover, this combination is also capable of reducing background noise at the microphone, provided the deviation of the noise is less than the first threshold (knee 201).

Still further, since a SONAD is controlled by audio signal amplitude alone, it cannot distinguish between a speech signal and a noise burst caused by multipath propagation. The noise burst causes the SONAD to stay "talked up"—operating in the high $V_{IN}$ region of the graph—such that the SONAD attenuator will seldom function. This anomaly greatly reduces the effectiveness with which conventional SONAD circuits eliminate noise. Accordingly, the use of the instant noise reduction circuitry preceding the SONAD attenuates these noise bursts, and hence, greatly enhances the effectiveness with which the SONAD attenuates noise.

Field evaluation of the weak signal noise reduction/improved SONAD system revealed yet another complication: the modulation level variation in typical FM radio systems is sufficiently great that the SONAD would sometimes operate at lower input levels, often causing significant attenuation to the high level speech signal. This undesirable condition creates objectionable fluctuations in the speech level during parts of words or syllables as the SONAD expands the dynamic range of the input signal. Furthermore, in repeater systems, the reduced average modulation level may degrade the signal-to-noise ratio, and necessitate frequent adjustment of the receiver volume control.

Since one of the principal advantages of the noise reduction system according to the present invention is the ability to retrofit into existing systems, the level variation problem must be handled at the fixed end as part of audio processing stage 192. Some type of automatic gain control (AGC) prior to the SONAD is required in order to control these speech level variations. If the AGC is located in the repeater transceiver transmit audio processing, then the noise reduction technique of FIG. 16 may be employed in existing systems with transceiver units having a conventional design.

A conventional AGC would bring up the level of noise between words or syllables, which would degrade the operation of a SONAD. Consequently, a "speech-controlled AGC" is required which would allow the gain to be adjusted only on voice peaks, and hold its gain fixed at all other times. One example of this type of AGC is the automatic level control (ALC) system described in U.S. Pat. No. 4,514,703 by Maher et al., which is incorporated herein by reference. The Maher ALC generates an AGC control signal only when an audio signal peak having a frequency between 300 and 1200 Hz is detected. Since the energy content of voice is predominantly lower than 1200 Hz, a detected spectral energy above 1200 Hz is indicative of noise. Hence, the desired "speech-controlled AGC" behavior is achieved. The Maher ALC will accommodate an input signal range of approximately 35 dB with negligible change in output level.

The Maher ALC, as originally designed, will operate continuously when subject to the noise produced by strong signal multipath at fading rates corresponding to vehicle speeds in excess of 45 miles per hour at 900 MHz. Under these particular conditions, the ALC will act like a conventional AGC and bring up noise between words or syllables. The problem is produced by random FM pops which excite the audio bandpass filter and produce a damped sinusoid transient with high peak-to-average amplitude ratio. This ringing frequency, which roughly corresponds to the peak of the audio shaping network response at approximately 300 to 450 Hz, confuses the ALC with its voice-like characteristics. A weak signal noise reduction circuit controlled only by discriminator noise will not remove this strong signal multipath noise. This problem however would be easily obviated if the complete strong signal/weak signal noise reduction technique of the present invention were employed. Another benefit of using the complete technique would be a substantial reduction in noise when the modulation level is low and the AGC is operating with high gain. However, as previously discussed, it is not always possible to use the complete strong signal/weak signal noise reduction configuration of FIG. 7.

Figure 19:
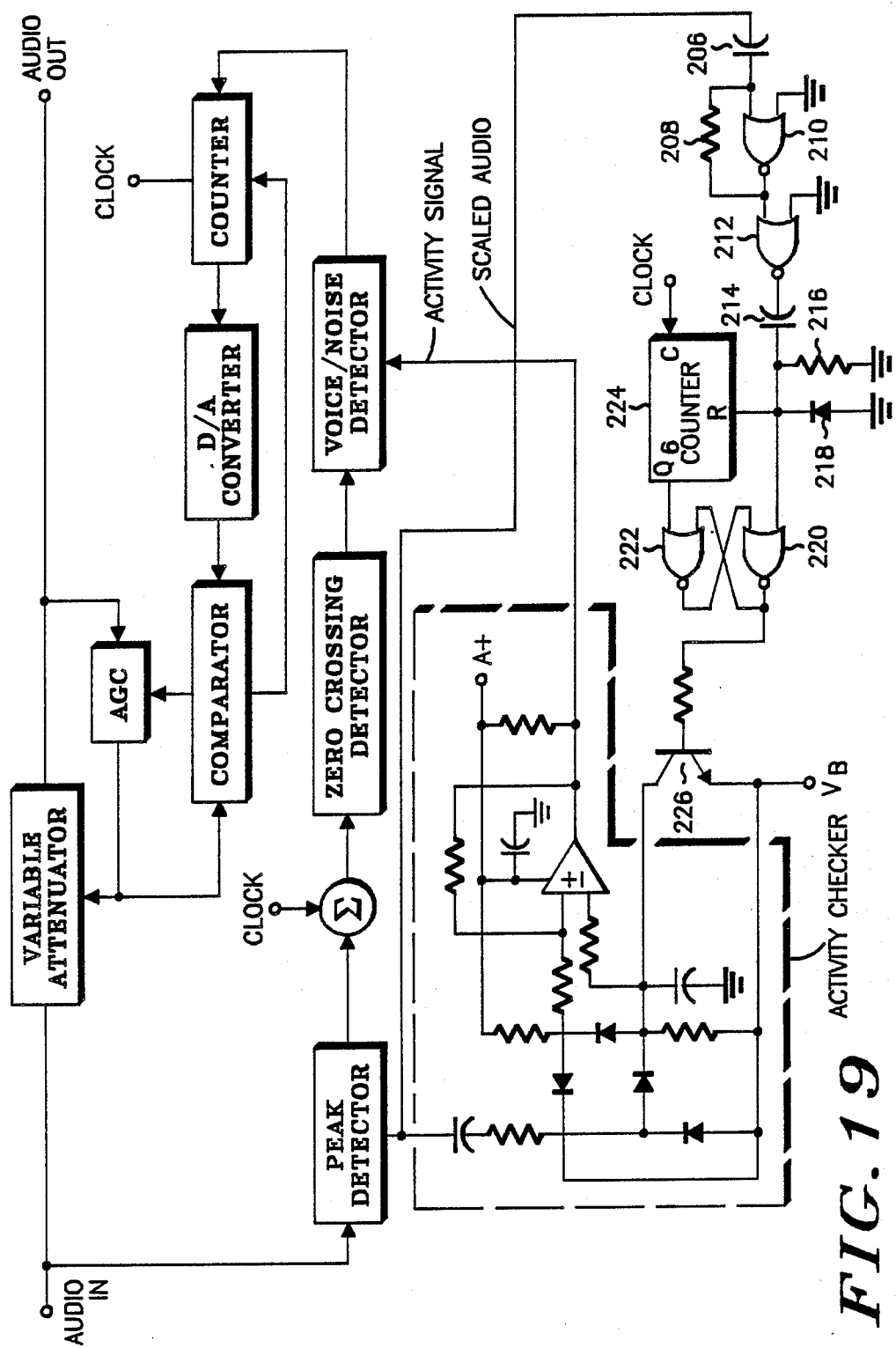
FIG. 19 is a circuit diagram of an improvement to the automatic level control (ALC) system of U.S. Pat. No. 4,514,703, incorporated herein by reference.

Referring now to FIG. 19, an improvement to the Maher ALC is illustrated, which permits the weak signal noise reduction/SONAD implementation to properly function. The general circuit blocks of FIG. 19 correspond to those of the Maher patent. (Refer to U.S. Pat. No. 4,514,703 for their description). The additional circuit components 206 through 226 represent the improvement, and will be described herein. The ALC improvement prevents erroneous AGC operation by generating a variable width pulse for each audio cycle at frequencies between 300–500 Hz. The pulse width in seconds for any audio frequency less than 500 Hz is given by the expression: $[1/f - 1/500]$. The variable width pulse is used to discharge the activity checker integrator capacitor, which helps to prevent the activity checker from giving a false detection of voice activity when strong, rapidly fading signals are being received. Some pulses will be generated when normal voice activity is detected, but these are few enough in number that the sensitivity of the activity checker is not significantly degraded.

As illustrated in FIG. 19, the scaled audio output of the peak detector is applied to NOR gate 210 via capacitor 206. NOR gate 210, having resistor 208 connected from its input to its output, simply acts as an amplifier for the audio signal. NOR gate 212 converts the amplified signal into a squarewave, while capacitor 214 and resistor 216 differentiates the squarewave into pulses. These pulses are applied to reset the S-R flip-flop 220/222, as well as to reset counter 224. The 15 kHz clock is divided by the $Q_6$ ($2^6 = 64$) output of the counter, such that a time interval of approximately 2 milliseconds exists between the occurrence of a reset pulse and the positive-going transition of output $Q_6$. If the time between reset pulses is less than 2 msec, then transistor 226 will be biased off and the normal operation of the activity checker will not be affected. If the time between reset pulses is greater than 2 msec, then transistor 226 will conduct during the time that the reset pulse interval exceeds 2 msec. When transistor 226 turns on, the activity checker integrator capacitor becomes clamped to $V_B$, which prevents a voltage build up on the detector from successive audio transients.

Figure 20:
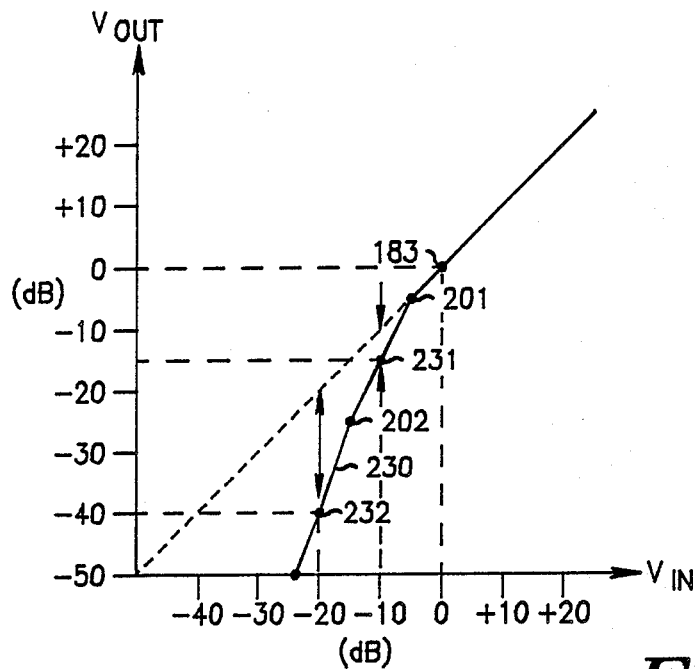
FIG. 20 is a graph illustrating the effect on the noise attenuation device characteristics of FIG. 18 resulting from the addition of the ALC audio processing stage of FIG. 19.

The improvement in operation of the SONAD with the use of the "speech-controlled AGC" may be seen from FIG. 20. Without the use of the speech-controlled AGC, the input level $V_{IN}$ will be allowed to vary. At normal speech input levels corresponding to 0 dB, a 0 dB output is produced. If the noise input level is $-20$ dB with respect to this normal speech input level, the noise output level would correspond to $-40$ dB. Hence, the SONAD will improve the 20 dB average signal-to-noise ratio of unprocessed normal level speech to 40 dB. At a reduced speech input level of approximately $-10$ dB, the unprocessed signal-to-noise ratio of 10 dB will be improved to 25 dB. However, the output amplitude of the reduced level speech has been diminished an additional 5 dB in passing through the SONAD.

If, however, the speech-controlled AGC is used in combination with the SONAD, the AGC will act to maintain a constant input level such that the effective noise level varies with the speech level. In terms of the graph of FIG. 20, the speech-controlled AGC will keep the input levels of either normal speech or reduced speech at 0 dB. Therefore, at the SONAD input noise level associated with reduced speech would be $-10$ dB, and the noise level associated with normal speech would be $-20$ dB. The SONAD will improve the 10 dB input signal-to-noise ratio of reduced speech to 15 dB (as compared to the previous result of 25 dB), while the SNR improvement of normal speech remains unchanged. Although the signal-to-noise ratio improvement is not as great for reduced speech with the speech-controlled AGC/SONAD combination, the output level of reduced speech is maintained instead of being further diminished. This output level improvement is noted with vertical distance arrows in FIG. 20, comparing the constant 1:1 slope line 186 (dashed) to the improved SONAD response curve 230 at two different reduced speech input levels. When preceded by the AGC, the SONAD output is approximately 5 dB higher for $-10$ dB reduced speech input levels at point 231, and approximately 20 dB higher for $-20$ dB reduced speech input levels at point 232.

In review, the addition of the speech-controlled AGC prevents the SONAD from having to operate at low levels of input modulation. Hence, the aforementioned problems of objectionable fluctuations in the speech level and degraded signal-to-noise ratios are alleviated with this aspect of the present invention.

Figure 21:
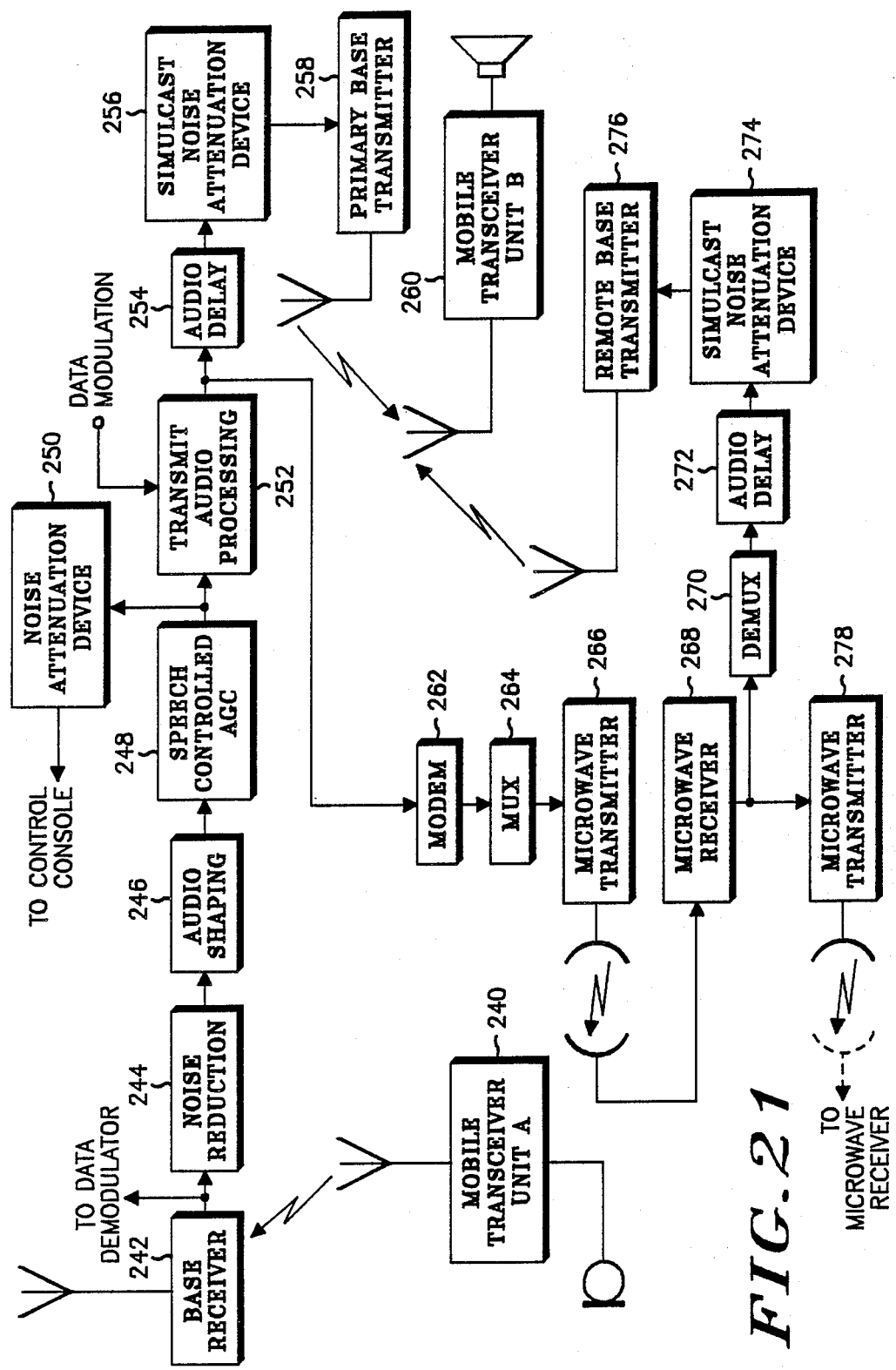
FIG. 21 illustrates a simulcast FM repeater system utilizing the noise reduction techniques in accordance with the present invention.

Referring now to FIG. 21, a simulcast FM repeater system is illustrated utilizing the noise reduction techniques of the present invention. The repeater system incorporates multiple transmitters operating in a "simulcast" or "quasi-synchronous" configuration in order to ensure signal penetration over wide geographic areas. In a simulcast FM repeater system, at least two FM signals are simultaneously transmitted from separate base sites. The remote base sites, which are not at the same geographic location as the repeater, are coupled to the primary base site by means of microwave links. In FIG. 21, mobile transceiver unit A is transmitting inbound to the repeater, while mobile transceiver unit B is receiving the outbound repeated signal simultaneously broadcast from the primary and remote base transmitters.

It is necessary that the modulation phase and amplitude of each of the base transmitters be as nearly identical as possible in order to avoid poor reception in overlapping transmission areas. Any modulation phase or amplitude imbalance will produce noise in the receiver output, even when the transceiver is motionless. This noise makes the regions in which overlapping signals are received appear to have poor system coverage. It has recently been discovered that this poor performance in the overlap regions is often caused by background noise in the simulcast signal distribution system which may originate in the inter-site transmission between the primary and remote transmitter stations. The background noise produces uncorrelated modulation of the simulcast transmitters when received by a mobile unit located in the overlap region.

This appears to be an ideal application for the noise reduction technique of the present invention. However, a unique requirement is placed upon the noise reduction system in that it be transparent to both the 3600 bit-per-second (bps) data used as signalling, and to the 150 bps data used for coded squelch which is sent simultaneously with the voice. The circuit which satisfies these objectives represents the next aspect of the present invention.

Again referring to FIG. 21, mobile transceiver unit A 240 transmits an FM signal to base receiver 242. The transceiver units need not incorporate any special transmit audio processing beyond that which is normally employed, i.e., pre-emphasis, clipping, and splatter filtering. However, the mobile receiver audio processing should include the weak signal noise reduction circuit in combination with the improved noise attenuation device implemented as shown in FIG. 16. The received signal at the base is then applied to noise reduction block 244, which, in order to be retrofit into an existing system, may be comprised of only the weak signal noise reduction circuit of FIG. 16. Block 246 performs audio shaping to meet the requirements of the particular system. Speech-controlled AGC 248 is then used to maintain a constant modulation level for noise attenuation device 250 and for transmit audio processing block 252. A representative speech-controlled AGC would be the Maher ALC circuit with the improvement shown in FIG. 19. Noise attenuation device 250 performs the audio processing for the control console audio. In the preferred embodiment, block 250 comprises the improved SONAD circuit illustrated in FIG. 17. Also note that noise attenuation device 250 may alternatively be interposed between AGC block 248 and the transmit audio processing block 252 for non-simulcast repeater systems.

Data modulation is applied to transmit audio processing block 252 for signalling and squelch. The transmit audio is then applied to audio delay 254 which may be necessary in order to equalize the modulation phases among the base transmitters. Simulcast noise attenuation device 256, which will be described in detail in accordance with FIG. 22, is a novel improvement to SONAD for use in systems in which sub-audible signalling must be sent together with speech on a single channel. Primary base transmitter 258 then transmits one of the simulcast FM signals to mobile transceiver unit B 260.

The transmit audio from audio processing block 252 is also sent through modem 262 and multiplexer 264 to microwave transmitter 266 for transmission to microwave receiver 268. The received microwave signal is then demultiplexed in block 270, delayed in block 272, and audio processed by simulcast noise attenuation device 274 as was done for the primary base transmitter. The remote base transmitter 276 then sends a simulcast FM signal to mobile transceiver B. Similarly, if a third simulcast base transmitter is required, microwave transmitter 278 would forward the signal to an appropriate microwave receiver at another remote site.

FIG. 22 illustrates simulcast noise attenuation device 256 and 274 of FIG. 21, in accordance with the present invention The audio input signal at 280 is applied to three paths: the upper path, which will pass any frequency input signal; the lower path, which passes only low speed data; and the center path, which determines the control signal proportional to the amplitude of either the voice or high-speed data. Current-controlled attenuators 290 and 310 are arranged in a complementary manner such that the subaudible signalling is always passed through the simulcast noise attenuation device, even when the speech signal is being attenuated. This constant low-speed data output level is illustrated in the graph of FIG. 23.

In the upper (voice) path, the audio is applied through capacitor 282 to charge coupled delay line 284. In conjunction with clock 286, the delay line performs the function of compensating for the delay of the noise rejection low pass filter 308 in the lower (data) path. The amount of loss introduced by the first current-controlled attenuator 290 is constant for input signal amplitudes greater than a given threshold, but increases for input signals less than the threshold. As a result, the attenuation characteristics for the upper voice path, which are shown in FIG. 23 as response 320, has a 1:1 slope above the threshold, and a 2:1 slope below the threshold. The 2:1 attenuation for low input levels provides the noise reduction function.

However, the 150 bps low speed data cannot pass through the upper path when attenuator 1 is in the high attenuation state. Consequently, the lower path is provided for the low speed data under these conditions. Noise rejection filter 308 prevents input noise from reaching the output. This filter should have a cutoff frequency less than 300 Hz, and have reasonably good phase response. The attenuation of the second current-controlled attenuator 310 is reduced as the attenuation if the first current-controlled attenuator 290 is increased.

Figure 23:
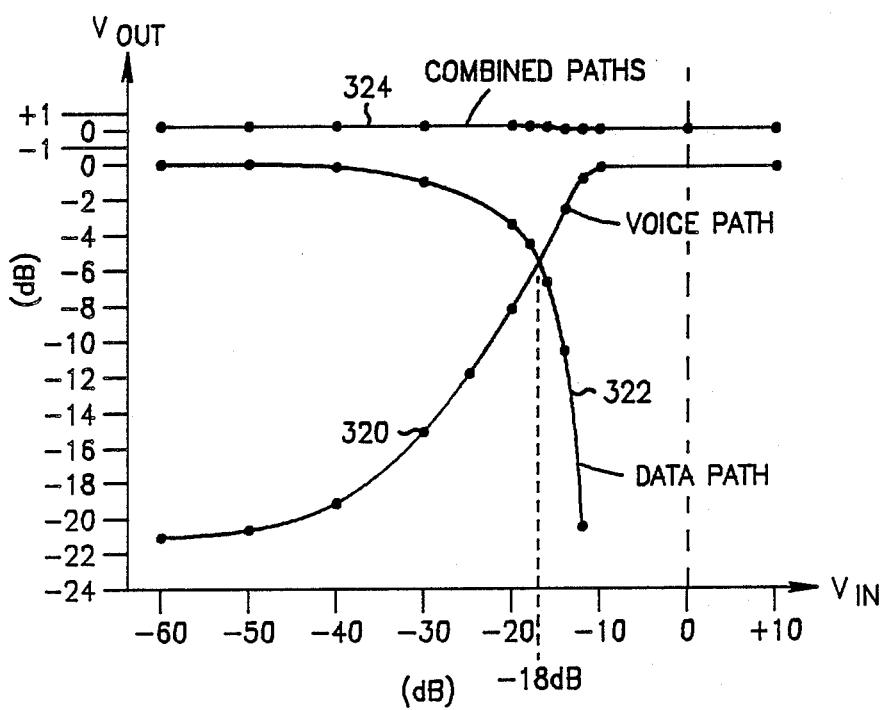
FIG. 23 is a graph illustrating the low-speed data amplitude level as a function of audio input level for the two paths the device shown in FIG. 22.

FIG. 23 illustrates this complementary attenuation of the data path as response 322. In the preferred embodiment, the attenuation paths cross at approximately −18 dB input level. The upper and lower path outputs are summed in summation network 292, and applied to the output at 294, thereby maintaining a constant transmission path for the low speed data. This combined path is represented in FIG. 23 as constant amplitude line 324 for the low speed data.

Voice detection prefilter 296 in the center path serves to filter the noise and low speed data from the input signal. Full wave rectifier 298 and envelope detector 302 measure the magnitude of the voice as was done in previous noise attenuation device embodiments. Clipper 304 presents the aforementioned threshold such that the attenuation is constant for higher input signal amplitudes. Complementary voltage-to-current converter 306 applies the attenuation control signal from the clipper to the two attenuators 290 and 310 in such a way that the resultant amplitude of the low speed data at the output of the circuit does not change as the path loss switches between the upper and lower paths. A DC balance signal may be applied to current-controlled attenuator 1 to ensure that the DC level at output node 294 is independent of the path selected. Monostable 300 is employed to pre-charge the envelope detector filter for a predetermined length of time when the transmitter PTT (push-to-talk) is activated. This prevents the loss of initial bits of data due to the syllabic response time of the envelope detector.

Figure 24:
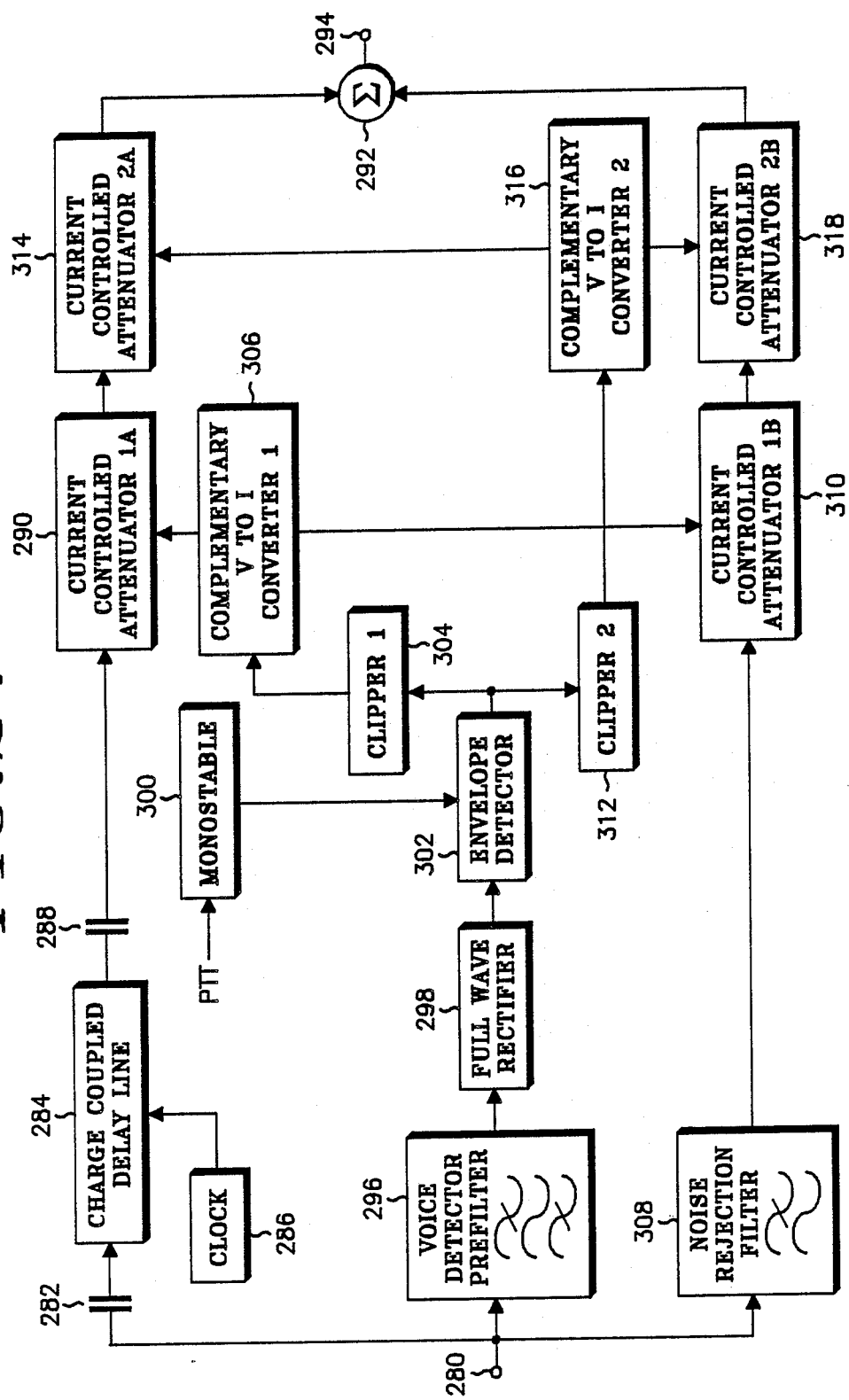
FIG. 24 is a block diagram of another embodiment of the simulcast noise attenuation device of FIG. 22 illustrating the implementation of two threshold levels.

FIG. 24 illustrates another embodiment of the simulcast noise attenuation device having two thresholds. The second amplitude threshold was added to the two transmission paths in the same manner as was done in FIG. 17. A second clipper 312, a second complementary voltage-to-current converter 316, and a pair of current-controlled attenuators 314 and 318 have been added in this embodiment. The attenuation response characteristics of the dual threshold embodiment of FIG. 24 would appear similar to the graph of FIG. 23, except that a greater amount of attenuation would be evident for output levels corresponding to low voice path (and high data path) input levels.

In review, several embodiments of noise reduction techniques have been illustrated in accordance with the present invention. The noise reduction techniques are especially effective in reducing the noise generated in an FM receiver which occurs when a vehicle moves through a region of multipath propagation. The technique may also alleviate acoustical background noise generated at a microphone input, as well as electrical noise generated in a speech transmission path within a simulcast FM repeater system. Various embodiments of the noise reduction techniques may be incorporated into existing systems and transceivers without creating compatibility problems.

Although embodiments of the invention have been described and shown on the drawings, the scope of the present invention is defined in the appended claims.

What is claimed is:

1. An FM receiver having an improved audio response to weak and Rayleigh-faded FM signals comprising:
   receiver means for receiving the FM signal, said receiver means including discriminator means for converting the FM signal into a baseband signal containing both in-band speech signals and above-band noise; and
   noise reduction means for minimizing noise bursts in the in-band speech signals of said baseband signal in response to the amount of above-band noise contained in said baseband signal only when the carrier-to-noise ratio (C/N) of the received FM signal is less than a predetermined C/N, said noise reduction means comprising:
   means for generating a noise control signal which is proportional to the magnitude of the above-band noise contained in said baseband signal;
   means for attenuating the in-band speech signals contained in said baseband signal in response to an attenuation control signal thereby providing noise-minimized speech signals; and
   means for generating said attenuation control signal in response to said noise control signal such that said attenuation control signal is substantially a constant when said noise control signal is below a predetermined threshold, and which changes proportionately with said noise control signal when said noise control signal is above said predetermined threshold.

2. The FM receiver according to claim 1, wherein said noise control signal generating means includes:
   high pass filter means, coupled to said receiver discriminator means, for passing only frequencies above the speech band;
   detector means, coupled to said high pass filter means, for providing a signal which corresponds to the magnitude of the high frequency discriminator noise passing through said high pass filter means; and
   low pass filter means, coupled to said detector means, for providing a smoothed control signal corresponding to the average magnitude of said detected noise.

3. The FM receiver according to claim 1, wherein said predetermined threshold corresponds to the FM noise threshold of said receiver means.

4. The FM receiver according to claim 1, wherein said predetermined threshold corresponds to an in-band audio signal-to-noise ratio of approximately 12 dB SINAD.

5. The FM receiver according to claim 1, wherein the gain of said noise reduction means is optimally set to provide speech signal attenuation within the range of 5 dB to 15 dB below a reference speech signal level when no FM signal is being received 6. The FM receiver according to claim 5, wherein said attenuation range is 8 dB to 10 dB.

7. The FM receiver according to claim 1, wherein said noise reduction means further comprises:
   means for generating a first control signal which is proportional to the strength of said received FM signal;
   means for combining said attenuation control signal with a second control signal such that said attenuating means is responsive to both of said control signals; and
   means for generating said second control signal in response to said first control signal such that said in-band speech signals are further attenuated during a Rayleigh fade when said first control signal decreases below a second predetermined threshold, said second predetermined threshold set relative to the magnitude of said first control signal.

8. The FM receiver according to claim 7, wherein said second control signal generating means causes said attenuating means to further attenuate said in-band speech signals at a ratio of X/Y greater than 1, where Y is the change in the amplitude of the received FM signal and X is the corresponding change in speech signal attenuation, such that the amount of attenuation increases at a greater rate than the rate of decrease in strength of the received FM signal during a Rayleigh fade.

9. The FM receiver according to claim 1, further comprising audio processing means for providing output speech signals from said noise-minimized speech signals, said audio processing means including noise attenuation means for selectively attenuating said noise-minimized speech signals having an amplitude less than a predetermined amplitude threshold, said noise attenuation means further minimizing noise bursts without substantially adversely affecting said noise-minimized speech signals having an amplitude greater than said predetermined amplitude threshold.

10. The FM receiver according to claim 9, wherein said noise attenuation means comprises:
means for generating a noise suppression signal which is proportional to the magnitude of the in-band speech signals contained in said baseband signal;
means for attenuating the in-band speech signals contained in said noise-minimized speech signals in response to a noise attenuation signal thereby providing said output speech signals; and
means for generating said noise attenuation signal in response to said noise suppression signal such that said noise attenuation signal is substantially a constant when said noise suppression signal is above a predetermined control signal value, and which changes proportionately with said noise suppression signal when said noise suppression signal is below said predetermined control signal value.

11. The FM receiver according to claim 10, wherein said noise suppression signal generating means includes:
band pass filter means, coupled to said receiver discriminator means, for passing only frequencies within the speech band;
detector means, coupled to said band pass filter means, for providing a signal which corresponds to the magnitude of the in-band speech signals passing through said band pass filter means; and
low pass filter means, coupled to said detector means, for providing a smoothed noise suppression signal corresponding to the average magnitude of the detected speech signal.

12. The FM receiver according to claim 10, wherein said noise attenuation signal generating means includes:
first means for increasing speech signal attenuation at a ratio of A/B greater than 1 for speech signals having an amplitude below a first predetermined input level, where B is the change in amplitude of said noise-minimized speech signals and A is the corresponding change in amplitude of said output speech signals; and
second means for increasing speech signal attenuation at a ratio of A'/B' greater than A/B for speech signals having an amplitude below a second predetermined input level, wherein A' and B' correspond to A and B at input levels below said second predetermined input level, such that the amount of attenuation increases at a substantially greater rate than the rate of decrease in amplitude of said noise-minimized speech signals.

13. The FM receiver according to claim 12, wherein the ratio A/B is at least 2:1, and wherein the ratio A'/B' is at least 3:1.

14. The FM receiver according to claim 12, wherein said first predetermined input level corresponds to no greater than 50 percent full system modulation.

15. The FM receiver according to claim 12, wherein said second predetermined input level corresponds to no greater than 15 percent full system modulation.

16. The FM receiver according to claim 9, wherein said audio processing means further includes AGC means, coupled to said noise attenuation means, for controlling the amplitude of said noise-minimized speech signals to be substantially constant when applied to said noise attenuation means.

17. The FM receiver according to claim 16, wherein said AGC means includes speech detection means for enabling said AGC means to change the amplitude of said noise-minimized speech signals only when speech activity is being detected, thereby preventing said AGC means from increasing the amplification of said output speech signals during a noise burst.

18. The FM receiver according to claim 17, wherein said AGC means further includes control means for preventing said speech detection means from erroneously detecting speech activity when said received FM signal is being subjected to strong-signal multipath interference at rapid fading rates.

19. An FM repeater communication system having improved audio response to weak and Rayleigh-faded FM signals, said FM communication system comprising:
base receiver means for receiving an inbound FM signal containing speech signals, said base receiver means including discriminator means for converting the FM signal into a baseband signal containing both in-band speech signals and above-band noise;
noise reduction means for minimizing noise bursts in the in-band speech signals of said baseband signal in response to the magnitude of the above-band noise contained in said baseband signal thereby producing outbound speech signals, said noise reduction means operating only when the carrier-to-noise ratio (C/N) of the received FM signal is less than a predetermined C/N;
audio processing means including noise attenuation means for providing noise-suppressed speech signals from said outbound speech signals and for selectively attenuating said outbound speech signals having an amplitude less than a predetermined amplitude threshold without substantially adversely affecting said outbound speech signals having an amplitude greater than said predetermined threshold; and
base transmitter means for transmitting said noise-suppressed speech signals via an outbound FM signal.

20. The FM communication system according to claim 19, wherein said noise reduction means comprises:
means for generating a noise control signal which is proportional to the magnitude of the above-band noise contained in said baseband signal;
means for attenuating the in-band speech signals contained in said baseband signal in response to an attenuation control signal thereby providing said noise-minimized speech signals; and
means for generating said attenuation control signal in response to said noise control signal such that said attenuation control signal is substantially a constant when said noise control signal is below a predetermined threshold, and which changes proportionately with said noise control signal when said noise control signal is above said predetermined threshold.

21. The FM communication system according to claim 20, wherein said predetermined threshold corresponds to the FM noise threshold of said receiver means.

22. The FM communication system according to claim 19, wherein the gain of said noise reduction means is optimally set to provide speech signal attenuation within the range of 5 dB to 15 dB below a reference speech signal level when no FM signal is being received.

23. The FM communication system according to claim 20, wherein said noise reduction means further comprises:
   means for generating a first control signal which is proportional to the strength of said received FM signal;
   means for combining said attenuation control signal with a second control signal such that said attenuating means is responsive to both of said control signals; and
   means for generating said second control signal in response to said first control signal such that said in-band speech signals are further attenuated during a Rayleigh fade when said first control signal decreases below a second predetermined threshold, said second predetermined threshold set relative to the magnitude of said first control signal.

24. The FM communication system according to claim 23, wherein said second control signal generating means causes said attenuating means to further attenuate said in-band speech signals at a ratio of X/Y greater than 1, where Y is the change in the amplitude of the received FM signal and X is the corresponding change in speech signal attenuation, such that the amount of attenuation increases at a greater rate than the rate of decrease in strength of the received FM signal during a Rayleigh fade.

25. The FM communication system according to claim 19, wherein said noise attenuation means comprises:
   means for generating a noise suppression signal which is proportional to the magnitude of the in-band speech signals contained in said baseband signal;
   means for attenuating the in-band speech signals contained in said noise-minimized speech signals in response to a noise attenuation signal thereby providing said output speech signals; and
   means for generating said noise attenuation signal in response to said noise suppression signal such that said noise attenuation signal is substantially a constant when said noise suppression signal is above a predetermined control signal value, and which changes proportionately with said noise suppression signal when said noise suppression signal is below said predetermined control signal value.

26. The FM communication system according to claim 25, wherein said predetermined control signal value corresponds to no greater than 50 percent full system modulation.

27. The FM communication system according to claim 19, wherein said audio processing means further includes AGC means, coupled to said noise attenuation means, for controlling the amplitude of said noise-minimized speech signals to be substantially constant when applied to said noise attenuation means.

28. The FM communication system according to claim 27, wherein said AGC means includes speech detection means for enabling said AGC means to change the amplitude of said noise-minimized speech signals only when speech activity is being detected, thereby preventing said AGC means from increasing the amplification of said output speech signals during a noise burst.

29. The FM communication system according to claim 19, further comprising:
   inter-site transmission means for communicating said outbound speech signals to a remote geographic location separate from the location of said base transmitter means, thereby providing remote outbound speech signals, said outbound speech signals including low speed data signals;
   remote audio processing means including simulcast noise attenuation means for providing remote noise-suppressed speech signals from said remote outbound speech signals and for selectively attenuating said remote outbound speech signals having an amplitude less than a predetermined amplitude threshold without substantially adversely affecting said remote outbound speech signals having an amplitude greater than said predetermined threshold, and without substantially adversely affecting the amplitude of said low speed data signals; and
   remote transmitter means for simultaneously transmitting said remote noise-suppressed speech signals with said low speed data signals via a simulcast outbound FM signal from said remote location.

30. The FM communication system according to claim 29, wherein said simulcast noise attenuation means includes:
   first attenuator means, having an input and output and responsive to a first simulcast attenuation signal, for increasing speech signal attenuation at a ratio of A/B greater than 1 for remote outbound speech and low speed data signals having an amplitude below a first predetermined input level, where B is the change in amplitude of input speech signals and A is the corresponding change in amplitude of output speech signals;
   second attenuator means, having an input and output and coupled to said first attenuator means and responsive to a second simulcast attenuation signal, for decreasing speech signal attenuation of only said low speed data signals in a complementary manner to the increasing speech signal attenuation of said first attenuator means; and
   summing means for combining said first and second attenuator means outputs to provide combined output data signals having an amplitude which is substantially constant as applied to said transmitter means.

31. The FM communication system according to claim 30, wherein the attenuation ratio A/B is at least 2:1.

32. The FM communication system according to claim 30, wherein said first predetermined input level corresponds to no greater than 50 percent full system modulation.

33. An audio processing circuit for an FM receiver having means for receiving speech signals which have been transmitted via an FM signal, said audio processing circuit providing output speech signals having improved audio response to weak and Rayleigh-faded FM signals, said audio processing circuit comprising:

noise attenuation means for selectively attenuating said received speech signals having an amplitude less than a predetermined amplitude threshold, said noise attenuation means minimizing noise bursts without substantially adversely affecting said received speech signals having an amplitude greater than said predetermined amplitude threshold, said noise attenuation means including:

first means for increasing speech signal attenuation, in response to a first noise attenuation signal, for speech signals having an amplitude below a first predetermined input level, at a ratio of A/B greater than 1, where B is the change in amplitude of said received speech signals and A is the corresponding change in amplitude of output speech signals; and second means for increasing speech signal attenuation, in response to a second noise attenuation signal, for speech signals having an amplitude below a second predetermined input level, at a ratio of A'/B' greater than A/B, wherein A' and B' correspond to A and B at input levels below said second predetermined input level, such that the amount of speech signal attenuation increases at a substantially greater rate than the rate of decrease in amplitude of said received speech signals.

34. The audio processing circuit according to claim 33, wherein the attenuation ratio A/B is at least 2:1.

35. The audio processing circuit according to claim 33, wherein the attenuation ratio A'/B' is at least 3:1.

36. The audio processing circuit according to claim 33, wherein said first predetermined input level corresponds to no greater than 50 percent full system modulation.

37. The audio processing circuit according to claim 33, wherein said second predetermined input level corresponds to no greater than 15 percent full system modulation.

38. The audio processing circuit according to claim 33, wherein said noise attenuation means further includes:

means for generating a noise suppression signal which is proportional to the magnitude of said received speech signals;

means for generating said first and second noise attenuation signals in response to said noise suppression signal such that said first and second noise attenuation signals are substantially a constant when said noise suppression signal is above a first predetermined control signal value, said first noise attenuation signal changing to attenuation ratio A/B when said noise suppression signal is below said first predetermined control signal value, said second noise attenuation signal changing to attenuation ratio A'/B' when said noise suppression signal is below a second predetermined control signal value less than said first predetermined control signal value.

39. The audio processing circuit according to claim 38, wherein said noise suppression signal generating means includes:

band pass filter means, coupled to said receiver means, for passing only frequencies within the speech band;

detector means, coupled to said band pass filter means, for providing a signal which corresponds to the magnitude of the received speech signals passing through said band pass filter means; and low pass filter means, coupled to said detector means, for providing a smoothed noise suppression signal corresponding to the average magnitude of the detected speech signal.

40. The audio processing circuit according to claim 38, wherein said noise attenuation signal generating means includes:

first threshold means for providing said first predetermined control signal value below which said first noise attenuation signal has an attenuation ratio A/B and above which said first noise attenuation signal is substantially a constant; and second threshold means for providing said second predetermined control signal value below which said second noise attenuation signal has an attenuation ratio of A'/B' and above which said second noise attenuation signal is substantially a constant.

41. The audio processing circuit according to claim 33, further comprising:

AGC means, coupled to said noise attenuation means, for controlling the amplitude of said received speech signals to be substantially constant when applied to said noise attenuation means.

42. The audio processing circuit according to claim 41, wherein said AGC means includes speech detection means for enabling said AGC means to change the amplitude of said received speech signals only when speech activity is being detected, thereby preventing said AGC means from increasing the amplification of said output speech signals during a noise burst.

43. The audio processing circuit according to claim 42, wherein said AGC means further includes control means for preventing said speech detection means from erroneously detecting speech activity when said received FM signal is being subjected to strong-signal multipath interference at rapid fading rates.

44. An audio processing circuit for improving the audio quality of transmitted speech signals in an FM repeater system having receiver means for receiving an inbound FM signal containing speech and low speed data signals, and having transmitter means for transmitting said speech and low speed data signals via an outbound FM signal, said audio processing circuit comprising:

noise attenuation means, coupled to said transmitter means, for selectively attenuating the received speech signals having an amplitude less than a predetermined amplitude threshold without substantially adversely affecting said received speech signals having an amplitude greater than said predetermined amplitude threshold, and without substantially adversely affecting the amplitude of said low speed data signals, said noise attenuation means including:

first attenuator means, responsive to a first simulcast attenuation signal, for increasing speech signal attenuation of said speech and low speed data signals having an amplitude below a first predetermined input level at a ratio of A/B greater than 1, where B is the change in amplitude of input speech signals and A is the corresponding change in amplitude of output speech signals; and second attenuator means, coupled to said first attenuator means and responsive to a second simulcast attenuation signal, for decreasing speech signal attenuation of only said low speed data signals in a complementary manner to the increasing speech signal attenuation of said first attenuator means such that the amplitude of said low speed data signals is substantially constant as applied to said transmitter means.

45. The audio processing circuit according to claim 44, wherein the attenuation ratio A/B is at least 2:1.

46. The audio processing circuit according to claim 44, wherein said first predetermined input level corresponds to no greater than 50 percent full system modulation.

47. The audio processing circuit according to claim 44, wherein said noise attenuation means further includes:
  means for generating a simulcast suppression signal which is proportional to the magnitude of said received speech signals;
  threshold means for providing said predetermined input level below which said speech signals and said low speed data signals are attenuated; and
  converter means for providing said first and second simulcast attenuation signals in response to said simulcast suppression signal, said first simulcast attenuation signal changing in a complementary manner to said second simulcast attenuation signal such that the amplitude of said low speed data signals is substantially a constant.

48. The audio processing circuit according to claim 44, wherein said noise attenuation means further includes:
  third attenuator means, coupled to said first attenuator means and responsive to a third simulcast attenuation signal, for increasing speech signal attenuation of said speech and low speed data signals having an amplitude below a second predetermined input level at a ratio of A'/B' greater than A/B, wherein A' and B' correspond to A and B at input levels below said second predetermined input level; and
  fourth attenuator means, coupled to said second attenuator means and responsive to a fourth simulcast attenuation signal, for decreasing speech signal attenuation of only said low speed data signals in a complementary manner to the increasing speech signal attenuation of said third attenuator means such that the amplitude of said low speed data signals is substantially constant as applied to said transmitter means.

49. The audio processing circuit according to claim 48, Wherein the attenuation ratio A'/B' is at least 3:1.

50. The audio processing circuit according to claim 48, wherein said second predetermined input level corresponds to no greater than 15 percent full system modulation.

51. The audio processing circuit according to claim 48, wherein said noise attenuation means further includes:
  second threshold means for providing said second predetermined input level below which said speech signals and said low speed data signals are further attenuated; and
  second converter means for providing said third and fourth simulcast attenuation signals in response to said simulcast suppression signal, said third simulcast attenuation signal changing in a complementary manner to said fourth simulcast attenuation signal such that the amplitude of said output data signals is substantially a constant.

52. A method of improving the audio response of an FM receiver to weak and Rayleigh-faded FM signals comprising the steps
  receiving the FM signal in a receiver means) said receiver means including discriminator means for converting the FM signal into a baseband signal containing both in-band speech signals and above-band noise; and
  noise reducing including minimizing noise bursts in the in-band speech signals of said baseband signal in response to the amount of the above-band noise contained in said baseband signal only when the carrier-to-noise ratio (C/N) of the received FM signal is less than a predetermined C/N, said noise reduction step comprising the steps of:
  generating a noise control signal which is proportional to the magnitude of the above-band noise contained in said baseband signal;
  attenuating the in-band speech signals contained in said baseband signal in response to an attenuation control signal thereby providing noise-minimized speech signals; and
  generating said attenuation control signal in response to said noise control signal such that said attenuation control signal is substantially a constant when said noise control signal is below a predetermined threshold, and which changes proportionately with said noise control signal when said noise control signal is above said predetermined threshold.

53. The method according to claim 52, wherein said predetermined threshold corresponds to the FM noise threshold of said receiver means.

54. The method according to claim 52, wherein said predetermined threshold corresponds to an in-band audio signal-to-noise ratio of approximately 12 dB SINAD.

55. The method according to claim 52, wherein said noise reducing step optimally provides speech signal attenuation within the range of 5 dB to 15 dB below a reference speech signal level when no FM signal is being received.

56. The method according to claim 55, wherein said attenuation range is 8 dB to 10 dB.

57. The method according to claim 52, wherein said noise reducing step further comprises the steps of:
  generating a first control signal which is proportional to the strength of said received FM signal;
  combining said attenuation control signal with a second control signal such that said attenuating means is responsive to both of said control signals; and
  generating said second control signal in response to said first control signal such that said in-band speech signals are further attenuated during a Rayleigh fade when said first control signal decreases below a second predetermined threshold, said second predetermined threshold set relative to the magnitude of said first control signal.

58. The method according to claim 57, wherein said second control signal generating step causes said attenuating step to further attenuate said in-band speech signals at a ratio of X/Y greater than 1, where Y is the change in the amplitude of the received FM signal and X is the corresponding change in speech signal attenuation, such that the amount of attenuation increases at a greater rate than the rate of decrease in strength of the received FM signal during a Rayleigh fade.

59. The method according to claim 52, further comprising the step of audio processing said noise-minimized speech signals to provide output speech signals, said audio processing step including the step of selectively attenuating said noise-minimized speech signals having an amplitude less than a predetermined amplitude threshold without substantially adversely affecting said noise-minimized speech signals having an amplitude greater than said predetermined amplitude threshold.

60. The method according to claim 59, wherein said selective attenuation step includes the steps of:
increasing speech signal attenuation below a first predetermined input level at a ratio of A/B greater than 1, where B is the change in amplitude of said noise-minimized speech signals and A is the corresponding change in amplitude of said output speech signals; and
further increasing speech signal attenuation below a second predetermined input level at a ratio of A'/B' greater than A/B, wherein A' and B' correspond to A and B at input levels below said second predetermined input level, such that the amount of attenuation increases at a substantially greater rate than the rate of decrease in amplitude of said noise-minimized speech signals.

61. The method according to claim 60, wherein the attenuation ratio A/B is at least 2:1, and wherein the attenuation ratio A'/B' is at least 3:1.

62. The method according to claim 60, wherein said first predetermined input level corresponds to no greater than 50 percent full system modulation.

63. The method according to claim 59, wherein said audio processing step further includes the step of AGC controlling the amplitude of said noise-minimized speech signals to be substantially constant when processed by said selective attenuation step.

64. The method according to claim 63, wherein said AGC controlling step includes the step of detecting speech activity and enabling said AGC step to change the amplitude of said noise-minimized speech signals only when speech activity is being detected, thereby preventing said AGC controlling step from increasing the amplification of said output speech signals during a noise burst.

65. The method according to claim 64, wherein said AGC controlling step further includes the step of preventing said speech detecting step from erroneously detecting speech activity when said received FM signal is being subjected to strong-signal multipath interference at rapid fading rates.

66. An FM receiver having an improved audio response to Rayleigh faded received signals comprising:
discriminating means for converting the received FM signal into an audio signal;
means for determining an average signal strength of the received signal;
means for generating a control signal which is substantially a constant for received signals having signal strengths greater than a predetermined level below said average signal strength and which changes proportionately with decreasing received signal strengths below said predetermined level; and
means for attenuating said audio signal in response to said control signal so that the audio signal is attenuated during a Rayleigh fade.

67. The receiver according to claim 66, wherein said predetermined level is within the range of 5-20 dB.

68. The receiver according to claim 67, wherein said predetermined level is within the range of 10-15 dB.

69. The receiver according to claim 66, wherein said average signal strength corresponds to the time averaged magnitude of said received signal for a time interval substantially longer than the time duration of a Rayleigh fade.

70. The receiver according to claim 66, wherein said attenuating means increases said audio signal attenuation at a ratio of X/Y greater than 1, where X is the change in attenuation and Y is the corresponding change in the amplitude of the received signal, whereby the amount of attenuation increases at a greater rate than the decrease in amplitude of a received signal during a Rayleigh fade.

71. The receiver according to claim 66, wherein said generating means generates said control signal which changes at a rate greater than the rate of change of the amplitude of the received signal.

72. The receiver according to claim 70, wherein said attenuating means comprises at least two cascaded attenuation circuits each having its respective amount of attenuation controlled by said control signal.

73. The receiver according to claim 66, wherein said attenuating means comprises at least one attenuator circuit in which the amount of attenuation it provides is controlled in response to said control signal.

74. The receiver according to claim 66, further comprising:
means, coupled to said attenuating means, for providing additional attenuation proportional to the high frequency noise components associated with said received signal, whereby additional attenuation is provided for received signals near the noise threshold of the receiver.

75. The receiver according to claim 66, wherein said received signals comprise FM signals having a peak deviation of less than 5 kHz.

76. A method for improving the audio response of an FM receiver for Rayleigh faded received signals comprising the steps of:
converting the received FM signal into an audio signal;
determining the average strength of the received signal; and
attenuating the audio signal so that a substantially constant amount of attenuation is provided for received signals greater than a predetermined level below the average strength of the received signal and so that increasing attenuation is provided as the strength of the received signal deceases below said predetermined level and so that said audio signal has a substantially constant frequency bandwidth.

77. The method according to claim 76, wherein said predetermined level is within the range of 5-20 dB.

78. The method according to claim 77, wherein said predetermined level is within the range of 10-15 dB.

79. The method according to claim 76, further comprising the steps of:
generating a control signal which is substantially a constant for received signals having signal strengths greater than a predetermined level below said average signal strength and which changes proportionately with decreasing received signal strengths below said predetermined level; and attenuating said audio signal in response to said control signal so that the audio is attenuated during a Rayleigh fade.

80. The method of claim 76, further comprising the step of:

providing additional attenuation in response to the high frequency components above the audio frequencies associated with said received signal, whereby additional attenuation is provided when the received signal is near the noise threshold of the receiver.

81. An FM receiver having an improved audio response for Rayleigh faded received signals comprising:

discriminator means for converting the received FM signals into audio signals; and means for controllably attenuating said audio signals so that substantially constant attenuation is provided for received signals greater than a certain signal level, said certain signal level consisting of a predetermined level below the average magnitude of the received signal, said attenuating means increasing attenuation of said audio signals when said received signals are less than said certain signal level, said attenuating means maintaining a substantially constant bandwidth to said audio signals.

82. The receiver according to claim 81, wherein said average magnitude of the received signal comprises the time averaged magnitude of said received signal for a time interval substantially longer than the time duration of a Rayleigh fade.

83. The receiver according to claim 81, wherein said attenuation means increases attenuation at a rate greater than the rate the amplitude of the received signal decreases.

84. The receiver according to claim 81, further comprising:

means coupled to said attenuating means for providing additional attenuation proportional to the high frequency noise components associated with said received signal, whereby additional attenuation is provided for received signals near the noise threshold of the receiver.

85. The receiver according to claim 81, wherein said predetermined level is within the range of 5-20 dB.

86. An FM receiver having an improved audio response to Rayleigh faded received FM signals comprising:

means for converting said received FM signals into amplitude varying audio signals;

means for generating a first signal which is proportional to the strength of said received FM signals;

means for attenuating said audio signals in response to a second signal; and means for generating said second signal in response to said first signal so that said audio signals are attenuated during a Rayleigh fade when said first signal decreases below a predetermined threshold, said predetermined threshold set relative to the average value of said first signal, whereby improved audio is provided in response to Rayleigh fading of the received signal regardless of the strength of the received signal.

87. The received according to claim 86, wherein said predeetermined threshold is within the range of 5-20 dB below the average value of said first signal.

88. The received according to claim 87, wherein said predetermined threshold is within the range of 10-15 dB below the average value of said first signal.

89. The received according to claim 86, wherein said second generating means generates a second signal during a Rayleigh fade which causes said attenuating means to increase audio signal attenuation at a ratio of X/Y greater than 1, where Y is the change in the amplitude of the received signal and X is the corresponding change in attenuation, whereby the amount of attenuation increases at a greater rate than the decrease in amplitude of the received signal during a Rayleigh fade.

90. The received according to claim 86, wherein said first signal generating means generates a signal which is proportional to the mathematical log of the strength of said received FM signals.

91. The receiver according to claim 90, further comprising:

means for providing a logarithmic to linear conversion of said second signal so that during Rayleigh fades said second signal is linearly proportional the strength of said received FM signals.

92. The received according to claim 86, wherein said attenuating means comprises a plurality of series connected attenuators.

93. The receiver according to claim 86, wherein said second signal generating means comprises means for detecting the average noise present in the received signal, said second signal changing in response to said detected noise exceeding a predetermined level to cause said attenuating means to attenuate the audio signals.

94. The received according to claim 93, wherein said predetermined level corresponds to a signal to noise level of approximately 12 dB SINAD.

95. A method for improving the audio response of an FM receiver when the received FM signals are Rayleigh faded, said method comprising the steps of:

converting the received FM signals into amplitude varying audio signals;

generating a first signal which is proportional to the strength of the received FM signals;

attenuating the audio signals in response to a second signal;

setting a predetermined threshold relative to an average value of the first signal; and generating the second signal in response to the first signal so that the audio signals are attenuated during a Rayleigh fade when said first signal decreases below the predetermined threshold.

96. The method according to claim 95, wherein said predetermined threshold is within the range of 5-20 dB below the average value of said first signal.

97. The method according to claim 95, wherein the step of generating said second signal further comprises the step of:

detecting the average noise present in the received signal and changing said second signal to provide additional attenuation of the audio signals when the detected noise reaches a predetermined level.

98. An FM receiver having an improved audio response to Rayleigh faded received FM signals comprising:

means for sensing Rayleigh fades which cause said received signal to decrease below a predetermined threshold set relative to the average strength of the received signal; and means for attenuating the receiver audio in response to said sensing means sensing the received signal decreasing below said predetermined threshold.

99. The receiver according to claim 98, wherein said predetermined threshold is within the range of 5–20 dB below the average signal strength of said FM signals.

100. The receiver according to claim 98, wherein said attenuating means attenuates the audio at a ratio of X/Y greater than 1, where Y is the decrease in amplitude of the received signal and X is the corresponding increase in attenuation, whereby attenuation increases at a greater rate than the decrease in signal amplitude when said signal decreases below said threshold during a Rayleigh fade.

* * * * *